US012749534B2

(12) United States Patent
Seo

(10) Patent No.: US 12,749,534 B2
(45) Date of Patent: Sep. 29, 2026

(54) MEMORY DEVICE AND METHOD OF OPERATING THE MEMORY DEVICE

(71) Applicant: SK hynix Inc., Icheon-si (KR)

(72) Inventor: Moon Sik Seo, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 53 days.

(21) Appl. No.: 18/934,383

(22) Filed: Nov. 1, 2024

(65) Prior Publication Data

US 2025/0316313 A1 Oct. 9, 2025

(30) Foreign Application Priority Data

Apr. 8, 2024 (KR) ........................ 10-2024-0047043

(51) Int. Cl.
*G11C 16/04* (2006.01)
*G11C 16/10* (2006.01)

(52) U.S. Cl.
CPC .......... *G11C 16/10* (2013.01); *G11C 16/0483* (2013.01)

(58) Field of Classification Search
CPC ............................ G11C 16/10; G11C 16/0483
See application file for complete search history.

(56) References Cited

U.S. PATENT DOCUMENTS

| | | | | |
|---|---|---|---|---|
| 2015/0221385 A1* | 8/2015 | Ahn | ........................ | G11C 16/14 365/185.2 |
| 2017/0092364 A1* | 3/2017 | Lee | ........................ | G11C 16/10 |
| 2020/0265893 A1* | 8/2020 | Park | ........................ | G11C 16/14 |
| 2022/0076756 A1* | 3/2022 | Lee | ........................ | G11C 16/14 |

FOREIGN PATENT DOCUMENTS

| | | |
|---|---|---|
| KR | 1020190113079 A | 10/2019 |
| KR | 102401056 B1 | 5/2022 |

* cited by examiner

*Primary Examiner* — Min Huang

(74) *Attorney, Agent, or Firm* — WILLIAM PARK AND ASSOCIATES LTD.

(57) ABSTRACT

Provided herein is a memory device and a method of operating the memory device. The memory device includes a string connected between a bit line and a source line, wherein the string includes one or more memory cells, a drain select transistor connected between the one or more memory cells and the bit line, and first and second source select transistors and a buffer source select transistor connected between the one or more memory cells and the source line, wherein the first and second source select transistors have different threshold voltages, and the buffer source select transistor is in an erase state.

26 Claims, 15 Drawing Sheets

MEMORY DEVICE AND METHOD OF OPERATING THE MEMORY DEVICE

CROSS-REFERENCE TO RELATED APPLICATION

The present application claims priority under 35 U.S.C. § 119(a) to Korean patent application number 10-2024-0047043 filed on Apr. 8, 2024 in the Korean Intellectual Property Office, the entire contents of which application is incorporated herein by reference.

BACKGROUND

1. Technical Field

Various embodiments of the present disclosure generally relate to a memory device and a method of operating the memory device, and more particularly to a memory device having a three-dimensional (3D) structure and a method of operating the memory device having the 3D structure.

2. Related Art

A memory device may include a memory cell array in which data is stored, and a peripheral circuit which performs a program operation, a read operation, or an erase operation.

The memory cell array may include a plurality of memory blocks, each of which may include a plurality of memory cells.

The peripheral circuit may include a control circuit which controls the overall operation of the memory device in response to a command transmitted from an external controller, and circuits which perform a program operation, a read operation, or an erase operation under the control of the control circuit.

The memory device may be formed in a two-dimensional (2D) structure including memory cells arranged horizontally on a substrate or in a three-dimensional (3D) structure including memory cells stacked vertically on a substrate.

In a memory cell array formed in a 3D structure, the size of memory cells and select transistors and the space between the memory cells or select transistors are smaller than memory cells and select transistors in a memory cell array formed in a 2D structure, thus causing leakage in the memory cell array.

SUMMARY

An embodiment of the present disclosure may provide for a memory device. The memory device may include a string connected between a bit line and a source line, wherein the string includes one or more memory cells, a drain select transistor connected between the one or more memory cells and the bit line, and first and second source select transistors and a buffer source select transistor connected between the one or more memory cells and the source line, wherein the first and second source select transistors have different threshold voltages, and wherein the buffer source select transistor has a threshold voltage lower than a higher threshold voltage between the threshold voltages of the first and second source select transistors.

An embodiment of the present disclosure may provide for a memory device. The memory device may include first to fourth strings connected in parallel between a bit line and a source line, wherein each of the first to fourth strings includes one or more memory cells connected between the bit line and the source line, a drain select transistor connected between the one or more memory cells and the bit line, and first and second source select transistors and a buffer source select transistor connected between the one or more memory cells and the source line, wherein the first and second source select transistors have different threshold voltages, and wherein the buffer source select transistor has a threshold voltage lower than a higher threshold voltage between the threshold voltages of the first and second source select transistors.

An embodiment of the present disclosure may provide for a method of operating a memory device. The method may include when a first string among first to fourth strings is selected, wherein each of the first to fourth strings includes first and second source select transistors and a buffer source select transistor that are connected between one or more memory cells and a source line and coded to different states, and wherein the buffer source select transistor has a threshold voltage lower than a higher threshold voltage between threshold voltages of the first and second source select transistors, turning on the first and second source select transistors included in the first string, turning off at least one of the first and second source select transistors included in each of the second to fourth strings, and reducing an amount of current flowing through the buffer source select transistor included in each of the first to fourth strings compared to an amount of current flowing through each of turned-on first and second source select transistors.

DETAILED DESCRIPTION

Specific structural or functional descriptions, disclosed herein, are exemplified to describe embodiments according to the concept of the present disclosure. The embodiments according to the concept of the present disclosure should not be construed as being limited to embodiments described below, and may be modified in various forms and replaced with other equivalent embodiments.

Hereinafter, although the terms "first" and "second" may be used herein to describe various elements, these elements should not be limited by these terms. The terms are used to distinguish one element from other elements.

Various embodiments of the present disclosure are directed to a memory device that prevents or mitigates leakage that may occur in the memory device, thus improving the reliability of the memory device.

Figure 1:
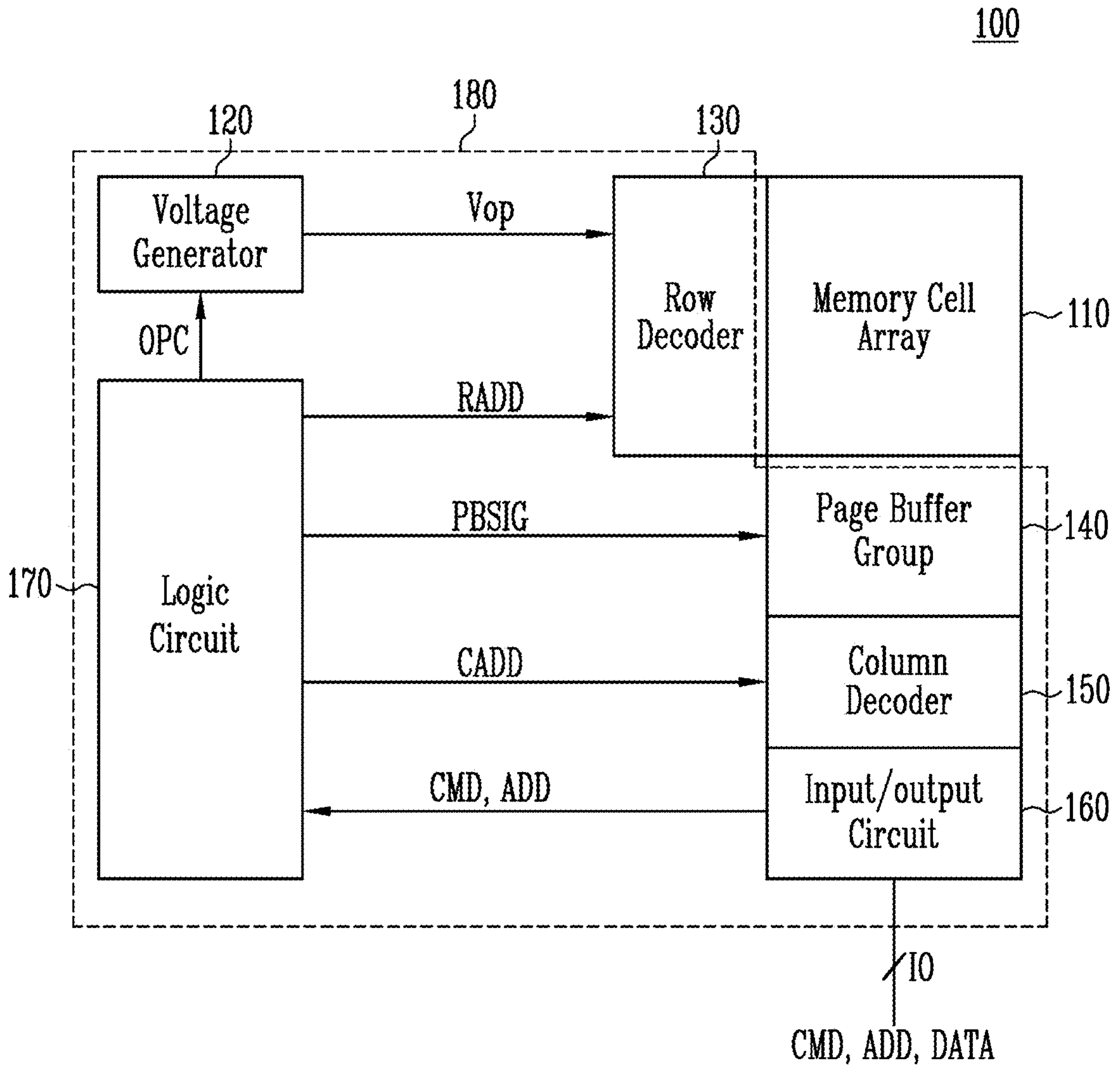
FIG. 1 is a diagram illustrating a memory device according to an embodiment of the present disclosure.

FIG. 1 is a diagram illustrating a memory device according to an embodiment of the present disclosure.

Referring to FIG. 1, a memory device 100 may include a memory cell array 110 in which data is stored, a peripheral circuit 180 which performs a program operation, a read operation or an erase operation, and a logic circuit 170 which controls the peripheral circuit 180.

The memory cell array 110 may include a plurality of memory blocks in which data is stored. Each of the memory blocks may include a plurality of memory cells, and may be implemented in a 2D structure in which the memory cells are arranged horizontally on a substrate or in a 3D structure in which the memory cells are stacked vertically on a substrate. The memory blocks according to the present embodiment may be implemented in a 3D structure.

The peripheral circuit 180 may include a voltage generator 120, a row decoder 130, a page buffer group 140, a column decoder 150, and an input/output circuit 160.

The voltage generator 120 may generate and output operating voltages Vop required for various operations in response to operation code OPC. For example, the voltage generator 120 may generate and output a program voltage, a verify voltage, a read voltage, a pass voltage, an erase voltage, etc.

The row decoder 130 may select one memory block from among the memory blocks included in the memory cell array 110 according to a row address RADD, and may transmit the operating voltages Vop to the selected memory block.

The page buffer group 140 may be connected to the memory cell array 110 through bit lines. For example, the page buffer group 140 may include page buffers connected to the bit lines, respectively. The page buffers may be simultaneously operated in response to page buffer control signals PBSIG, and may store data during a program or read operation. For this operation, each of the page buffers may include a plurality of latches in which data is stored. The number of latches may vary depending on a program method. For example, the page buffers may be designed differently depending on the number of bits that can be stored in one memory cell, and may be designed differently depending on the number of verify voltages used in a verify operation. The words "simultaneous" and "simultaneously" as used herein with respect to processes mean that the processes take place on overlapping intervals of time. For example, if a first process takes place over a first interval of time and a second process takes place simultaneously over a second interval of time, then the first and second intervals at least partially overlap each other such that there exists a time at which the first and second processes are both taking place.

The column decoder 150 may transfer data DATA between the input/output circuit 160 and the page buffer group 140 according to a column address CADD.

The input/output circuit 160 may be connected to a controller (not illustrated) through input/output lines (IO). The input/output circuit 160 may receive or output a command CMD, an address ADD, and data DATA through the input/output lines (IO). For example, the input/output circuit 160 may transmit the command CMD and the address ADD, received through the input/output lines (IO), to the logic circuit 170, and may transmit the data DATA, received through the input/output lines (IO), to the column decoder 150. The input/output circuit 160 may output the data DATA, received from the column decoder 150, to an external device through the input/output lines (IO).

The logic circuit 170 may output the operation code OPC, the row address RADD, the page buffer control signals PBSIG, and the column address CADD in response to the command CMD and the address ADD. For example, the logic circuit 170 may include software which executes a program operation, a read operation or an erase operation in response to the command CMD and the address ADD, and hardware which outputs the operation code OPC, the row address RADD, the page buffer control signals PBSIG, and the column address CADD under the control of the software.

Figure 2:
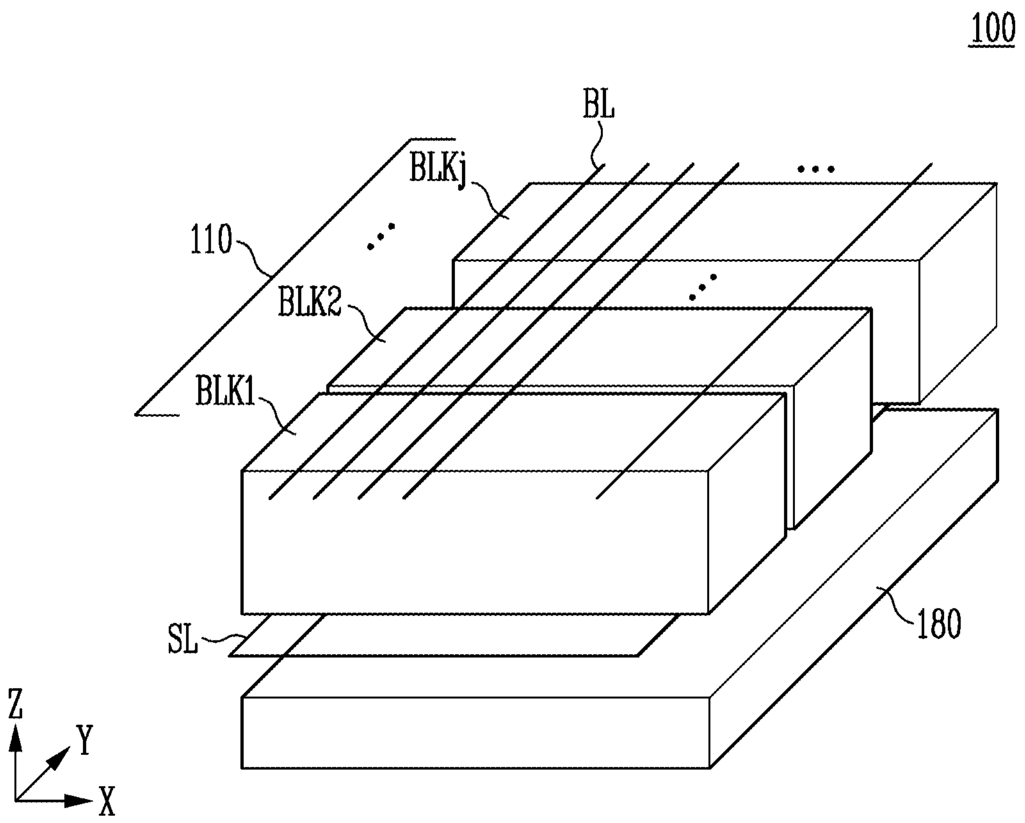
FIG. 2 is a diagram illustrating an embodiment of the arrangement of a memory cell array and a peripheral circuit.

FIG. 2 is a diagram illustrating an embodiment of the arrangement of a memory cell array and a peripheral circuit.

Referring to FIG. 2, the memory device 100 may include a peripheral circuit 180 and a memory cell array 110. The peripheral circuit 180 may be arranged on a substrate (not illustrated), and the memory cell array 110 may be disposed over the peripheral circuit 180. The memory cell array 110 may include first to j-th memory blocks BLK1 to BLKj. Bit lines BL may be disposed on the first to j-th memory blocks BLK1 to BLKj, and a source line SL may be disposed under the first to j-th memory blocks BLK1 to BLKj. Apart from the structure illustrated in FIG. 2, the bit lines BL may be disposed under the first to j-th memory blocks BLK1 to BLKj, and the source line SL may be disposed on the first to j-th memory blocks BLK1 to BLKj.

The plurality of bit lines BL may be arranged to be spaced apart from each other along an X direction, and may extend along a Y direction. The first to j-th memory blocks BLK1 to BLKj may be arranged to be spaced apart from each other along a Y direction. The source line SL may be connected in common to the first to j-th memory blocks BLK1 to BLKj.

The first to j-th memory blocks BLK1 to BLKj may be configured in the same manner. Of the memory blocks, the first memory block BLK1 will be described in detail by way of example.

Figure 3:
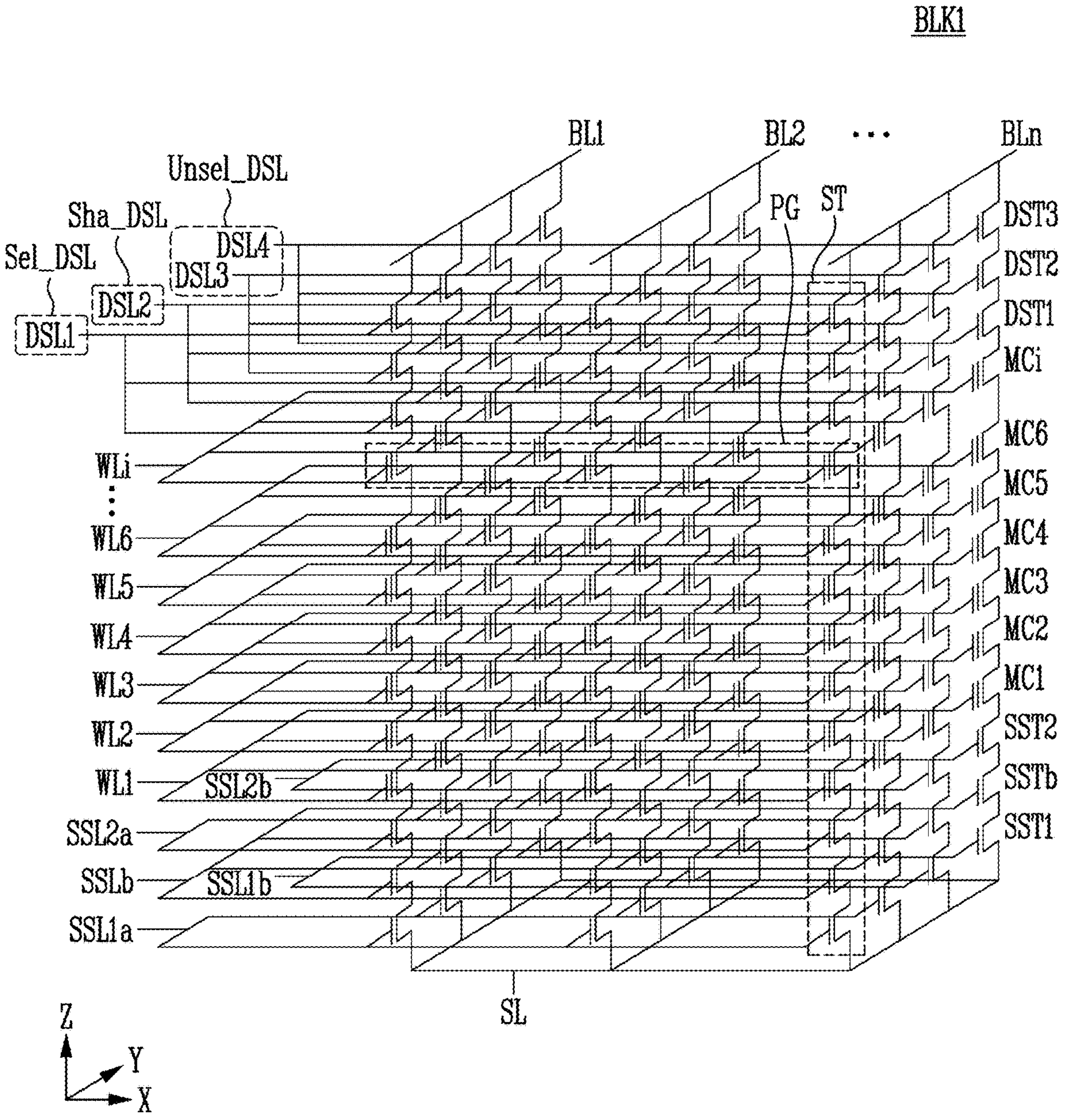
FIG. 3 is a circuit diagram illustrating a memory block according to a first embodiment of the present disclosure.
Figure 4:
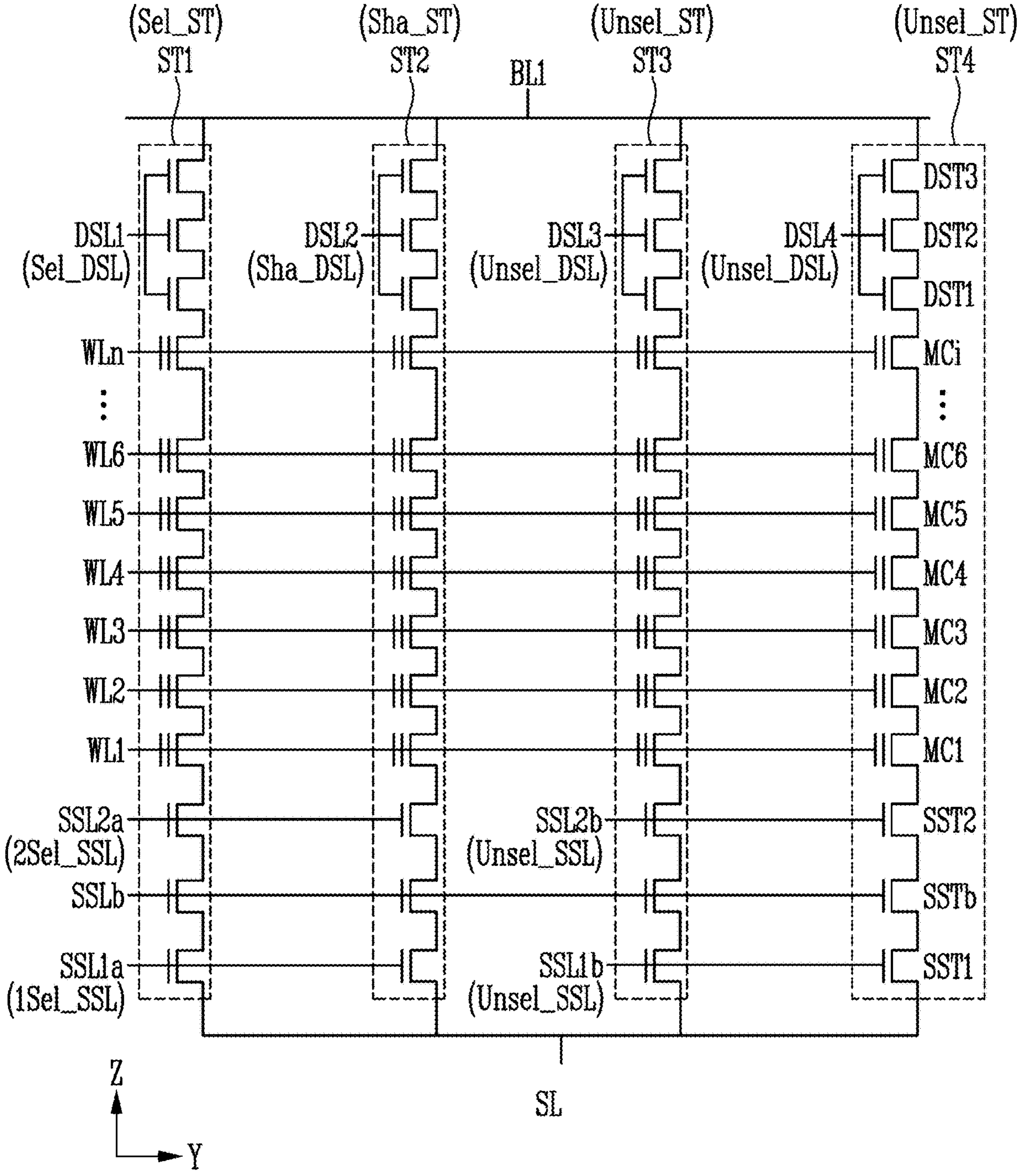
FIG. 4 is a circuit diagram illustrating strings connected to the same bit line according to an embodiment of the present disclosure.

FIG. 3 is a circuit diagram illustrating a memory block according to a first embodiment of the present disclosure, and FIG. 4 is a circuit diagram illustrating strings connected to the same bit line.

Referring to FIG. 3, the first memory block BLK1 may include a plurality of strings ST connected between first to n-th bit lines BL1 to BLn and a source line SL. Because the first to n-th bit lines BL1 to BLn extend along a Y direction and are arranged to be spaced apart from each other along an X direction, the strings ST may be arranged to be spaced apart from each other along the X and Y directions. For example, strings ST may be connected between the first bit line BL1 and the source line SL, and strings ST may be connected between the second bit line BL2 and the source line SL. In this way, the strings ST may be arranged between the n-th bit line BLn and the source line SL. The strings ST may extend along a Z direction between the first to n-th bit lines BL1 to BLn and the source line SL.

Any one string ST among the strings ST connected to the n-th bit line BLn is described below by way of example. The string ST may include a first source select transistor SST1, a buffer source select transistor SSTb, a second source select transistor SST2, first to i-th memory cells MC1 to MCi, and first to third drain select transistors DST1 to DST3. Because the first memory block BLK1 illustrated in FIG. 3 is intended to explain the structure of a memory block, the number of buffer source select transistors, source select transistors, memory cells, and drain select transistors, which are included in the strings ST, may be changed depending on the memory device.

Gates of the first source select transistors SST1 included in different strings ST may be connected to a 1a-th source select line SSL1*a* or a 1b-th source select line SSL1*b*, gates of the buffer source select transistors SSTb may be connected to a buffer source select line SSLb, gates of the second source select transistors SST2 may be connected to a 2a-th source select line SSL2*a* or a 2b-th source select line SSL2*b*, gates of the first to i-th memory cells MC1 to MCi may be connected to first to i-th word lines WL1 to WLi, and gates of the first to third drain select transistors DST1 to DST3 may be connected to first to fourth drain select lines DSL1 to DSL4.

The source select transistors arranged along the X direction may be connected to the same source select line, and the source select transistors arranged in the Y direction may be connected to the same source select line or to different source select lines depending on the position. For example, the source select transistors included in the strings ST connected to different bit lines may be connected to the same source select line, some of the source select transistors included in strings ST connected to the same bit line may be connected to the same source select line, and the others may be connected to different source select lines. Regardless of the bit lines, the buffer source select transistors SSTb included in different strings ST may be connected in common to the same buffer source select line SSLb.

A connection structure of the source select transistors will be described in detail below.

Some of the first source select transistors SST1 arranged in the Y direction may be connected to the 1a-th source select line SSL1*a*, and the others may be connected to the 1b-th source select line SSL1*b*. The 1b-th source select line SSL1*b* may be a line separated from the 1a-th source select line SSL1*a*. Therefore, a voltage applied to the 1a-th source select line SSL1*a* may be different from a voltage applied to the 1b-th source select line SSL1*b*. In this way, some of the second source select transistors SST2 may be connected to the 2a-th source select line SSL2*a*, and the others may be connected to the 2b-th source select line SSL2*b*. Memory cells formed on the same layer among the first to i-th memory cells MC1 to MCi may be connected to the same word line. For example, the first memory cells MC1 included in different strings ST may be connected in common to the first word line WL1, and the i-th memory cells MCi included in different strings ST may be connected in common to the i-th word line WLi. A group of memory cells included in different strings ST and connected to the same word line may be a page (PG). Therefore, the number of pages (PG) included in one memory block may be identical to the number of word lines connected to the memory block. For example, when i word lines are connected to the first memory block BLK1, the first memory block BLK1 may include i pages (PG).

The first to third drain select transistors DST1 to DST3 included in different strings ST may be connected to drain select lines separated from each other. In detail, among the first to third drain select transistors DST1 to DST3, drain select transistors arranged along the X direction may be connected to the same drain select line, and drain select transistors arranged along the Y direction may be connected to different drain select lines.

Among the first drain select transistors DST1, drain select transistors arranged along the Y direction may be connected to the first to fourth drain select lines DSL1 to DSL4. Among the second drain select transistors DST2, drain select transistors arranged along the Y direction may be connected to the first to fourth drain select lines DSL1 to DSL4. Among the third drain select transistors DST3, drain select transistors arranged along the Y direction may be connected to the first to fourth drain select lines DSL1 to DSL4.

The strings ST connected to the first and second drain select lines DSL1 and DSL2 may be connected to the 1a-th and 2a-th source select lines SSL1*a* and SSL2*a* and the buffer source select line SSLb. The strings ST connected to the third and fourth drain select lines DSL3 and DSL4 may be connected to the 1b-th and 2b-th source select lines SSL1*b* and SSL2*b* and the buffer source select line SSLb.

Referring to FIGS. 3 and 4, during a program operation, a read operation or an erase operation, the strings ST may be selected depending on a drain select line Sel_DSL selected from among the first to fourth drain select lines DSL1 to DSL4. A program operation is described below by way of example. The strings ST connected to the 1a-th source select line SSL1*a*, the buffer source select line SSLb, and the 2a-th source select line SSL2*a* may be connected to the first or second drain select line DSL1 or DSL2. Assuming that, of the first and second drain select lines DSL1 and DSL2, the first drain select line DSL1 is the selected drain select line Sel_DSL, the second drain select line DSL2 may be a shared drain select line Sha_DSL. The remaining third and fourth drain select lines DSL3 and DSL4 may be unselected drain select lines Unsel_DSL.

The first string ST1 connected to the selected drain select line Sel_DSL may be a selected string Sel_ST, the second string ST2 connected to the shared drain select line Sha_DSL may be a shared string Sha_ST, and the third and fourth strings ST3 and ST4 connected to the unselected drain select lines Unsel_DSL may be unselected strings Unsel_ST.

That is, among the first to fourth strings ST1 to ST4 connected in parallel between the first bit line BL1 and the source line SL, the first string ST1 connected to the selected drain select line Sel_DSL may be the selected string Sel_ST, and the second string ST2 connected to the shared drain select line Sha_DSL may be the shared string Sha_ST. The shared string Sha_ST may be included in the unselected strings Unsel_ST.

Figure 5:
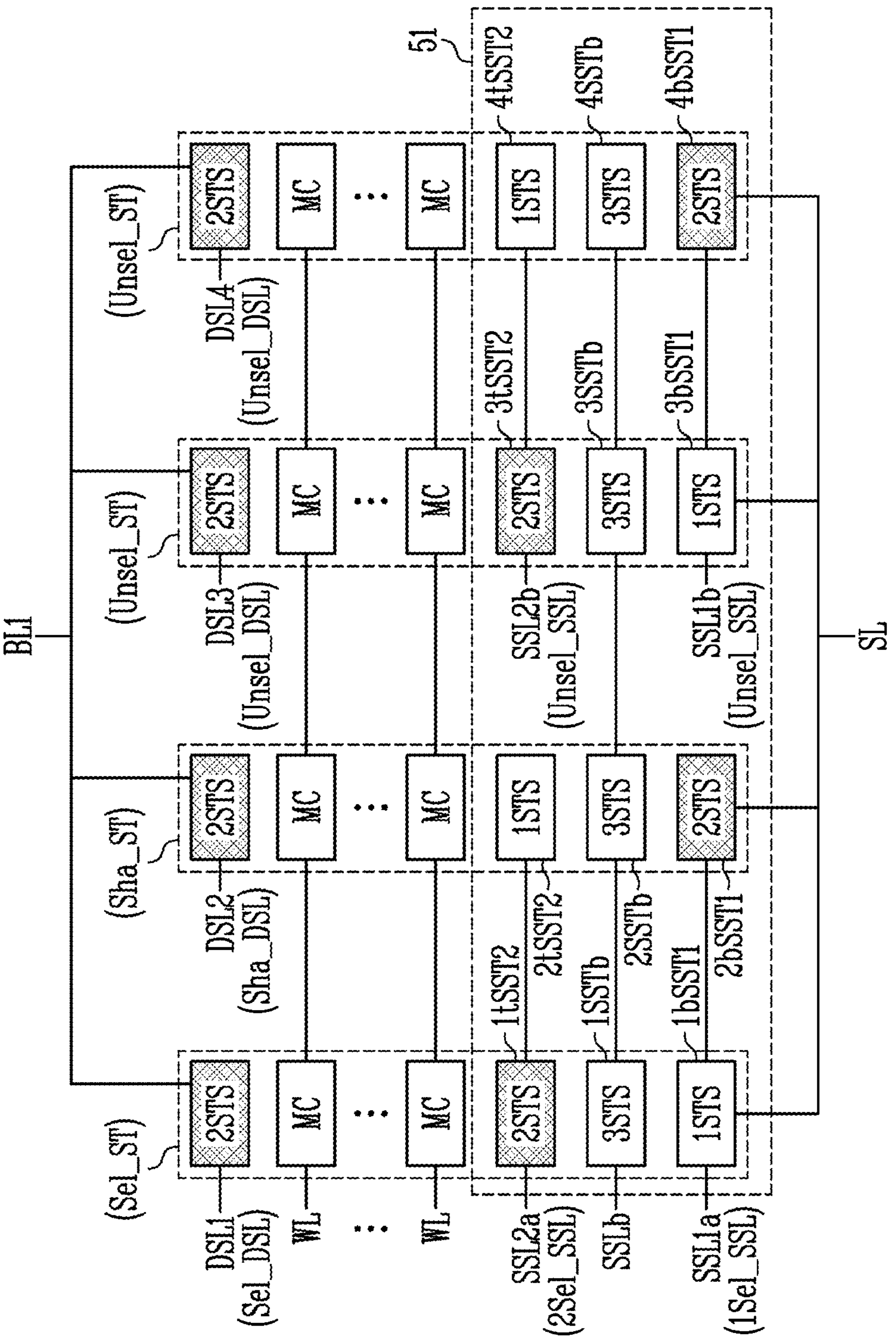
FIG. 5 is a diagram illustrating a method of coding source select transistors according to a first embodiment.

FIG. 5 is a diagram illustrating a method of coding source select transistors according to a first embodiment.

Referring to FIG. 5, the first source select transistors SST illustrated in FIG. 4 may include first to fourth bottom source select transistors 1*b*SST1 to 4*b*SST1. The second source select transistors SST2 illustrated in FIG. 4 may include first to fourth top source select transistors 1*t*SST2 to 4*t*SST2. The first to fourth bottom source select transistors 1*b*SST1 to 4*b*SST1 may be disposed below the first to fourth top source select transistors 1*t*SST2 to 4*t*SST2. The buffer source select transistors SSTb illustrated in FIG. 4 may include first to fourth buffer source select transistors 1SSTb to 4SSTb. In the first embodiment, the first to fourth buffer source select transistors 1SSTb to 4SSTb may be disposed between the first to fourth bottom source select transistors 1*b*SST1 to 4*b*SST1 and the first to fourth top source select transistors 1*t*SST2 to 4*t*SST2.

Gates of the first and second bottom source select transistors 1*b*SST1 and 2*b*SST1 may be connected in common to the 1a-th source select line SSL1*a*, and gates of the third and fourth bottom source select transistors 3*b*SST1 and 4*b*SST1 may be connected in common to the 1b-th source select line SSL1*b*. Gates of the first and second top source select transistors 1*t*SST2 and 2*t*SST2 may be connected in common to the 2a-th source select line SSL2*a*, and gates of the third and fourth top source select transistors 3*t*SST2 and 4*t*SST2 may be connected in common to the 2b-th source select line SSL2*b*. Gates of the first to fourth buffer source select transistors 1SSTb to 4SSTb may be connected in common to the buffer source select line SSLb.

During a program operation, a read operation or an erase operation, the source select transistors 51 may be coded differently to control the source region of the selected string Sel_ST. The source select transistors connected to the same source select line may be coded to have different threshold voltages, and the buffer source select transistors may be coded to have the same threshold voltage.

For example, the first and second bottom source select transistors 1*b*SST1 and 2*b*SST1 connected to the 1a-th source select line SSL1*a* may be coded to have different threshold voltages, and the third and fourth bottom source select transistors 3*b*SST1 and 4*b*SST1 connected to the 1b-th source select line SSL1*b* may be coded to have different threshold voltages. The first and second top source select transistors 1*t*SST2 and 2*t*SST2 connected to the 2a-th source select line SSL2*a* may be coded to have different threshold voltages, and the third and fourth top source select transistors 3*t*SST2 and 4*t*SST2 connected to the 2b-th source select line SSL2*b* may be coded to have different threshold voltages.

When the first bottom source select transistor 1*b*SST1 is coded to a first state 1STS, the second bottom source select transistor 2*b*SST1 may be coded to a second state 2STS different from the first state 1STS. For example, a threshold voltage corresponding to the first state 1STS may be lower than a threshold voltage corresponding to the second state 2STS. For example, the first state 1STS may be an erase state, and the second state 2STS may be a program state. When the third bottom source select transistor 3*b*SST1 is coded to the first state 1STS, the fourth bottom source select transistor 4*b*SST1 may be coded to the second state 2STS. When the first top source select transistor 1*t*SST2 is coded to the second state 2STS, the second top source select transistor 2*t*SST2 may be coded to the first state 1STS. When the third top source select transistor 3*t*SST2 is coded to the second state 2STS, the fourth top source select transistor 4*t*SST2 may be coded to the first state 1STS.

The first to fourth buffer source select transistors 1SSTb to 4SSTb may be coded to a third state 3STS having a threshold voltage lower than that of a transistor having the highest threshold voltage among source select transistors included in the same string. For example, the third state 3STS may be a state having a threshold voltage lower than that in the second state 2STS. The third state 3STS may be a state having a threshold voltage lower than that in the first state 1STS. For example, the third state 3STS may be a state having a threshold voltage equal to that in the first state 1STS. Here, a method of coding a transistor to the second state 2STS may be performed in the same manner as the method of programming each memory cell.

The drain select transistors connected to the first to fourth drain select lines DSL1 to DSL4, respectively, may be coded to the second state 2STS.

Because the source select transistors 51 are differently coded, source select transistors connected to the same source select line may be operated differently depending on the voltage applied to the source select line. For example, the source select transistors connected to the same source select line may be simultaneously turned off, simultaneously turned on, or differently turned on or off depending on the voltage applied to the source select line.

The description is made based on the first and second bottom source select transistors 1*b*SST1 and 2*b*SST1 connected to the 1a-th source select line SSL1*a* by way of example. When a voltage lower than the threshold voltages of the first and second bottom source select transistors 1*b*SST1 and 2*b*SST1 is applied to the 1a-th source select line SSL1*a*, both the first and second bottom source select transistors 1*b*SST1 and 2*b*SST1 may be turned off. When a voltage higher than the threshold voltages of the first and second bottom source select transistors 1*b*SST1 and 2*b*SST1 is applied to the 1a-th source select line SSL1*a*, both the first and second bottom source select transistors 1*b*SST1 and 2*b*SST1 may be turned on. When a voltage higher than the threshold voltage of the first bottom source select transistor 1*b*SST1 and lower than the threshold voltage of the second bottom source select transistor 2*b*SST1 is applied to the 1a-th source select line SSL1*a*, the first bottom source select transistor 1*b*SST1 may be turned on, and the second bottom source select transistor 2*b*SST1 may be turned off.

All of the first to fourth buffer source select transistors 1SSTb to 4SSTb are coded to the third state 3STS. Therefore, when a voltage lower than the threshold voltages of the first to fourth buffer source select transistors 1SSTb to 4SSTb is applied to the buffer source select line SSLb, the first to fourth buffer source select transistors 1SSTb to 4SSTb may be turned off. On the other hand, when a voltage higher than the threshold voltages of the first to fourth buffer source select transistors 1SSTb to 4SSTb is applied to the buffer source select line SSLb, the first to fourth buffer source select transistors 1SSTb to 4SSTb may be turned on.

The turn-on level of the first to fourth buffer source select transistors 1SSTb to 4SSTb may be changed depending on the voltage applied to the buffer source select line SSLb. For example, as the turn-on level of the first to fourth buffer source select transistors 1SSTb to 4SSTb is lower, the amount of current flowing through each of the first to fourth buffer source select transistors 1SSTb to 4SSTb may be reduced.

In an embodiment, the channel voltage of the selected string Sel_ST may be decreased and the channel voltages of the shared string Sha_ST and the unselected strings Unsel_ST may be increased by adjusting the level of the voltage applied to the buffer source select line SSLb.

A method of operating a memory device according to an embodiment will be described below.

Figure 6:
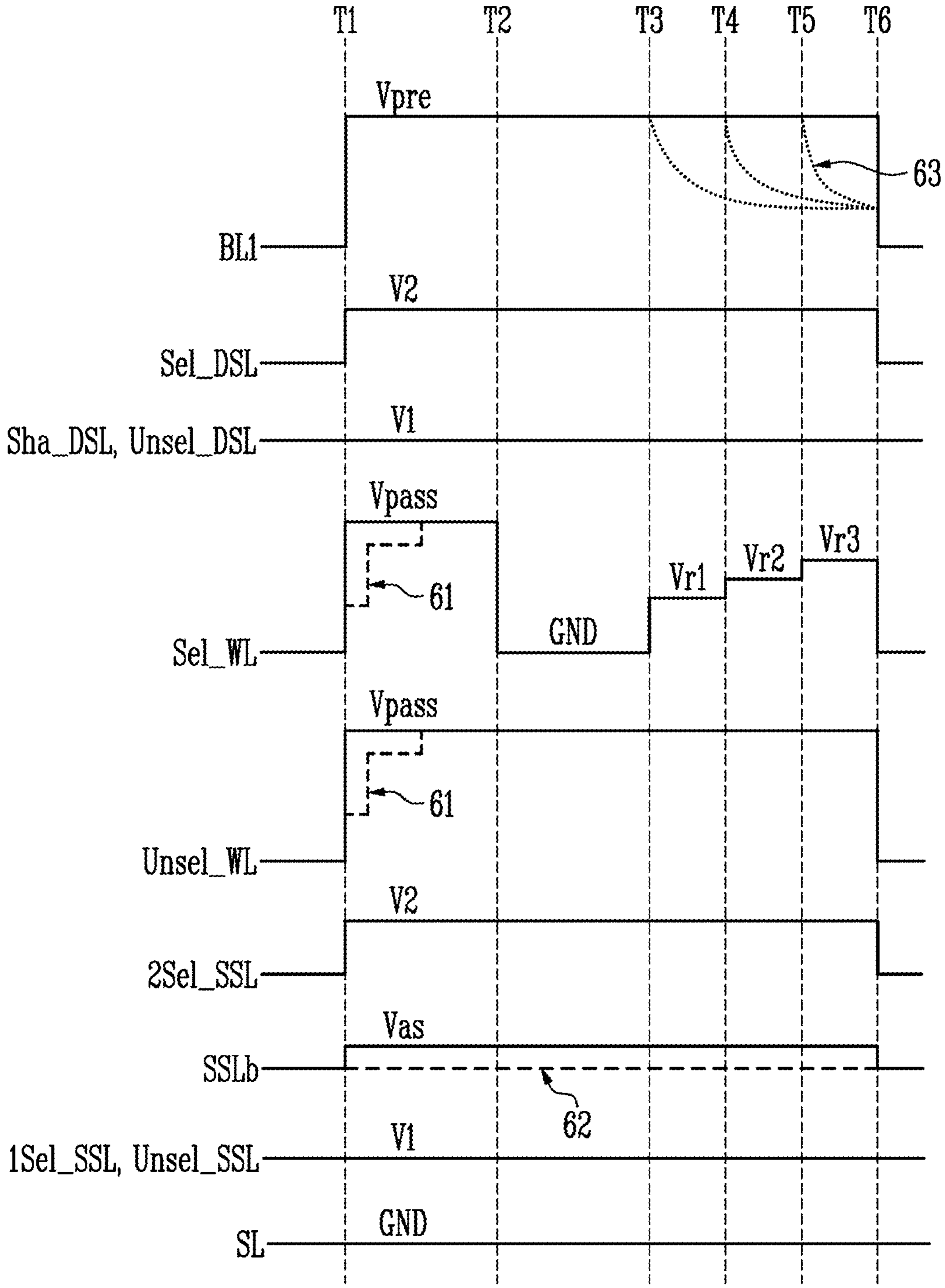
FIG. 6 is a timing diagram illustrating a read operation according to an embodiment of the present disclosure.
Figure 7:
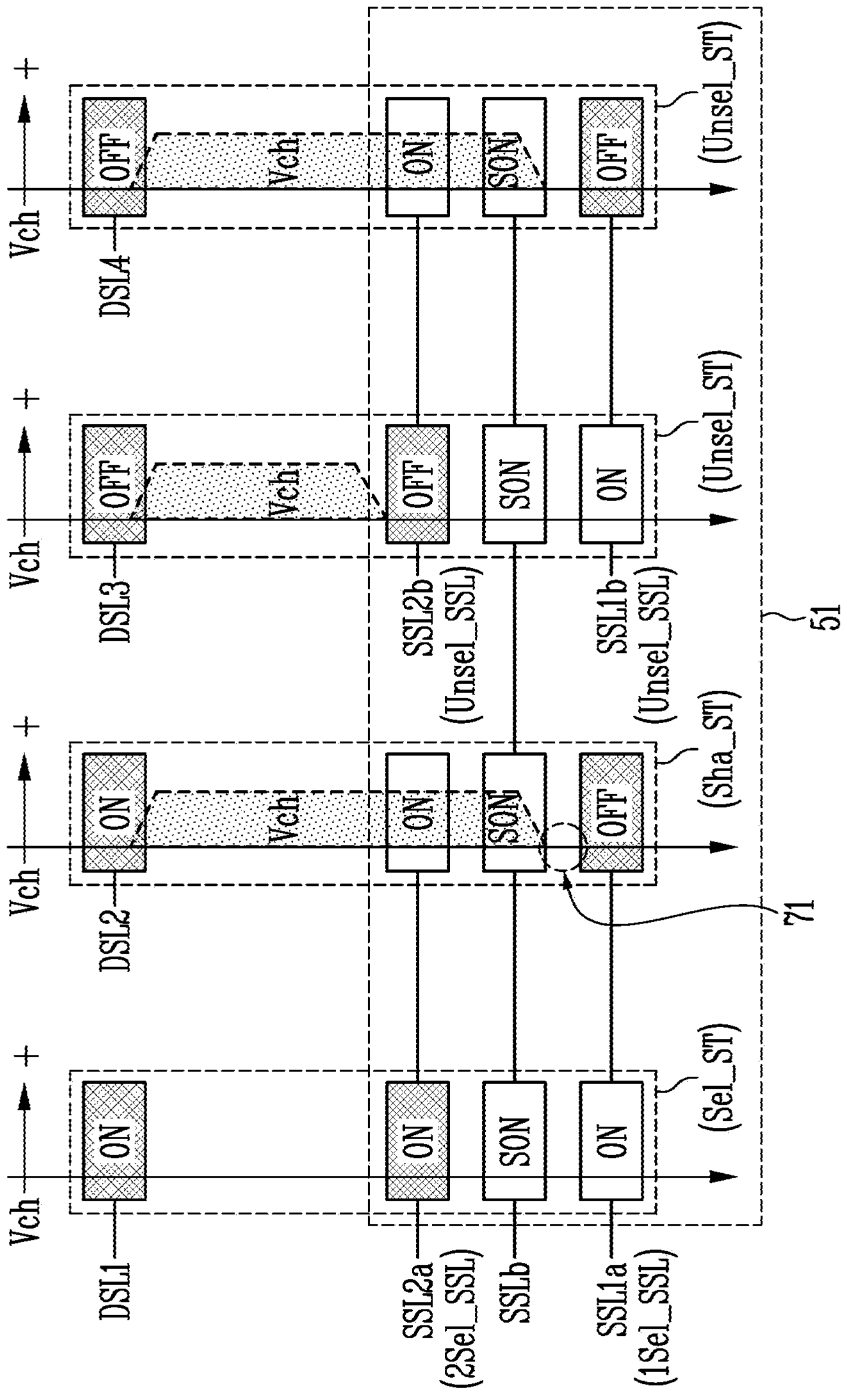
FIG. 7 is a diagram illustrating a channel voltage according to an embodiment of the present disclosure.

FIG. 6 is a timing diagram illustrating a read operation according to an embodiment of the present disclosure, and FIG. 7 is a diagram illustrating a channel voltage according to an embodiment of the present disclosure.

Referring to FIGS. 5 to 7, a channel boosting step may be performed during a period from first to second times T1-T2, a discharge step may be performed during a period from second to third times T2-T3, and a read step may be performed during a period from third to sixth times T3-T6. In some embodiments, the channel boosting step and the discharge step may be performed to initialize channels before the read step, or may be skipped. Individual steps will be described in detail below.

The channel boosting step performed during the period from the first to second times T1-T2 refers to the step of increasing the voltages of channels. At the channel boosting step, a precharge voltage Vpre higher than 0 V may be applied to a first bit line BL1, and a ground voltage GND may be applied to the source line SL. A second voltage V2 may be applied to the selected drain select line Sel_DSL, and a first voltage V1 may be applied to the shared drain select line Sha_DSL and unselected drain select lines Unsel_DSL. The second voltage V2 may be a voltage higher than the first voltage V1, and may be set to a voltage that allows drain select transistors or source select transistors to be turned on. Because the second voltage V2 is applied only to the selected drain select line Sel_DSL among the drain select lines, a drain select transistor connected to the selected drain select line Sel_DSL may be turned on. Drain select transistors connected to the shared drain select line Sha_DSL and the unselected drain select lines Unsel_DSL may be turned off.

A pass voltage Vpass may be applied to a selected word line Sel_WL and unselected word lines Unsel_WL. The pass voltage Vpass may be a voltage applied to the word lines to form channels in the strings. For example, the pass voltage Vpass may be set to a positive voltage at which all memory cells included in the selected string Sel_ST can be turned on. The pass voltage Vpass may be simultaneously applied to the selected word line Sel_WL and the unselected word lines Unsel_WL. At the first time T1, the pass voltage Vpass having a target level may be applied. Alternatively, the pass voltage Vpass having a level lower than the target level may be applied at the first time T1, and the level of the pass voltage Vpass may be increased stepwise up to the target level before the second time T2 (61).

The first voltage V1 may be applied to a first selected source select line 1Sel_SS and unselected source select lines Unsel_SSL, and the second voltage V2 may be applied to a second selected source select line 2Sel_SSL. The second voltage V2 may have the same level as a turn-on voltage Von applied to the selected drain select line Sel_DSL.

An auxiliary voltage Vas may be applied to the buffer source select line SSLb. The auxiliary voltage Vas may be set to a level that allows first to fourth buffer source select transistors (e.g., 1SSTb to 4SSTb of FIG. 5) connected to the buffer source select line SSLb to enter a partial turn-on state (i.e., semi-turn-on state: SON). Alternatively, the auxiliary voltage Vas may be set to the first voltage V1, the ground voltage GND, or 0 V (62). Here, the semi-turn-on (SON) may refer to the state in which the transistor is turned on at a level lower than the turn-on level of a transistor turned on by the turn-on voltage Von or the second voltage V2. When the first to fourth buffer source select transistors (e.g., 1SSTb to 4SSTb of FIG. 5) are partially turned on (SON) by the auxiliary voltage Vas, the amount of current flowing through the first to fourth buffer source select transistors (e.g., 1SSTb to 4SSTb of FIG. 5) may become less than the amount of current flowing through the transistor that is turned on (ON) by the second voltage V2.

As shown in the embodiment described with reference to FIG. 5, it is assumed that the first bottom source select transistor 1*b*SST1 connected to the first selected source select line 1Sel_SSL is in the first state 1STS and the second bottom source select transistor 2*b*SST1 is in the second state 2STS. It is assumed that the first top source select transistor 1*t*SST2 connected to the second selected source select line 2Sel_SSL is in the second state 2STS and the second top source select transistor 2*t*SST2 is in the first state 1STS.

When the first voltage V1 is applied to the first selected source select line 1Sel_SSL and the second voltage V2 higher than the first voltage V1 is applied to the second selected source select line 2Sel_SSL, the first bottom source select transistor 1*b*SST1 and the first top source select transistor 1*t*SST2 which are included in the selected string Sel_ST may be turned on, the second bottom source select transistor 2*b*SST1 which is included in the shared string Sha_ST may be turned off, and the second top source select transistor 2*t*SST2 may be turned on. For example, the first voltage V1 may have a level higher than a threshold voltage corresponding to the first state, and the second voltage may have a level higher than a threshold voltage corresponding to the second state. For example, the first voltage V1 may be the ground voltage GND, and the second voltage V2 may be the turn-on voltage Von.

Because the first bottom source select transistor 1*b*SST1 and the first top source select transistor 1*t*SST2 of the selected string Sel_ST are turned on, and the first buffer source select transistor 1SSTb is partially turned on (semi-turn-on: SON), the channel of the selected string Sel_ST may be electrically connected to the source line SL. Due thereto, the channel voltage may be decreased.

Although the second top source select transistor 2*t*SST2 of the shared string Sha_ST is turned on (ON), the second bottom source select transistor 2*b*SST1 is turned off (OFF), and the second buffer source select transistor 2SSTb is partially turned on (SON), and thus the channel voltage Vch of the shared string Sha_ST may be boosted between the second bottom source select transistor 2*b*SST1 and the second buffer source select transistor 2SSTb (71) from the drain select transistor. The partially turned-on (SON) second buffer source select transistor 2SSTb may reduce the amount of current that may flow between the turned-on (ON) second top source select transistor 2*t*SST2 and the turned-off (OFF) second bottom source select transistor 2*b*SST1. Therefore, in an embodiment, leakage that may occur in the turned-off (OFF) second bottom source select transistor 2*b*SST1 may be prevented or reduced.

As in the case of the embodiment described with reference to FIG. 5, it is assumed that the third bottom source select transistor 3*b*SST1 and the fourth top source select transistor 4*t*SST2, which are connected to the unselected source select lines Unsel_SSL, are in the first state 1STS and that the fourth bottom source select transistor 4*b*SST1 and the third top source select transistor 3*t*SST2 are in the second state 2STS.

Because the first voltage V1 is applied to the unselected source select lines Unsel_SSL, the third bottom source select transistor 3*b*SST1 and the fourth top source select transistor 4*t*SST2, which are in the first state 1STS, may be turned on (ON), and the fourth bottom source select transistor 4*b*SST1 and the third top source select transistor 3*t*SST2, which are in the second state 2STS, may be turned off (OFF).

Because the third and fourth buffer source select transistors 3SSTb and 4SSTb of the unselected strings Unsel_ST are partially turned on (SON), the channels of the unselected strings Unsel_ST may be electrically disconnected from the source line SL. Due thereto, the channel voltage Vch may be increased.

In the unselected string Unsel_ST connected to the third drain select line DSL3, channel boosting may occur between the drain select transistor and the turned-off (OFF) third top source select transistor 3tSST2. Even if leakage occurs in the turned-off (OFF) third top source select transistor 3tSST2, the third buffer source select transistor 3SSTb is partially turned on (SON), and thus leakage may be suppressed between the third top source select transistor 3tSST2 and the third buffer source select transistor 3SSTb.

In the unselected string Unsel_ST connected to the fourth drain select line DSL4, the fourth top source select transistor 4tSST2 is turned on (ON), but the fourth bottom source select transistor 4bSST1 is turned off (OFF), and the fourth buffer source select transistor 4SSTb is partially turned on (SON). Accordingly, the channel voltage Vch may be boosted between the fourth bottom source select transistor 4bSST1 and the fourth buffer source select transistor 4SSTb from the drain select transistor. The partially turned-on (SON) fourth buffer source select transistor 4SSTb may reduce the amount of current that may flow between the turned-on (ON) fourth top source select transistor 4tSST2 and the turned-off (OFF) fourth bottom source select transistor 4bSST1. Therefore, in an embodiment, leakage that may occur in the turned-off (OFF) fourth bottom source select transistor 4bSST1 may be prevented or reduced.

When the channel boosting step during the period from the first to second times T1-T2 is terminated, a discharge step may be performed during the period from the second to third times T2-T3. When the second time T2 at which the discharge step starts is reached, the selected word line Sel_WL may be discharged to the level of the ground voltage GND.

When the discharge step during the period from the second to third times T2-T3 is terminated, a read step may be performed during a period from third to sixth times T3-T6. At the read step, various read voltages may be used depending on the program state of the memory cells. For example, a first read voltage Vr1 may be applied to the selected word line Sel_WL. When the first read voltage Vr1 is applied to the selected word line Sel_WL, data in a selected memory cell in the selected string Sel_ST may be sensed depending on the threshold voltage of the selected memory cell. For example, when the threshold voltage of the selected memory cell is equal to or higher than the first read voltage Vr1, the selected memory cell may be turned off, and thus the potential of the first bit line BL1 may be maintained at the precharge voltage Vpre. When the threshold voltage of the selected memory cell is lower than the read voltage Vr1, the selected memory cell may be turned on, and thus the potential of the first bit line BL1 may become lower than the precharge voltage Vpre (63). In this way, during a period from fourth to fifth times T4-T5, a read step using a second read voltage Vr2 may be performed, and during a period from the fifth to sixth times T5-T6, a read step using a third read voltage Vr3 may be performed. The levels of the read voltages and the number of different read voltages may vary depending on the program method of the memory device.

At a sixth time T6, all lines may be discharged.

Figure 8:
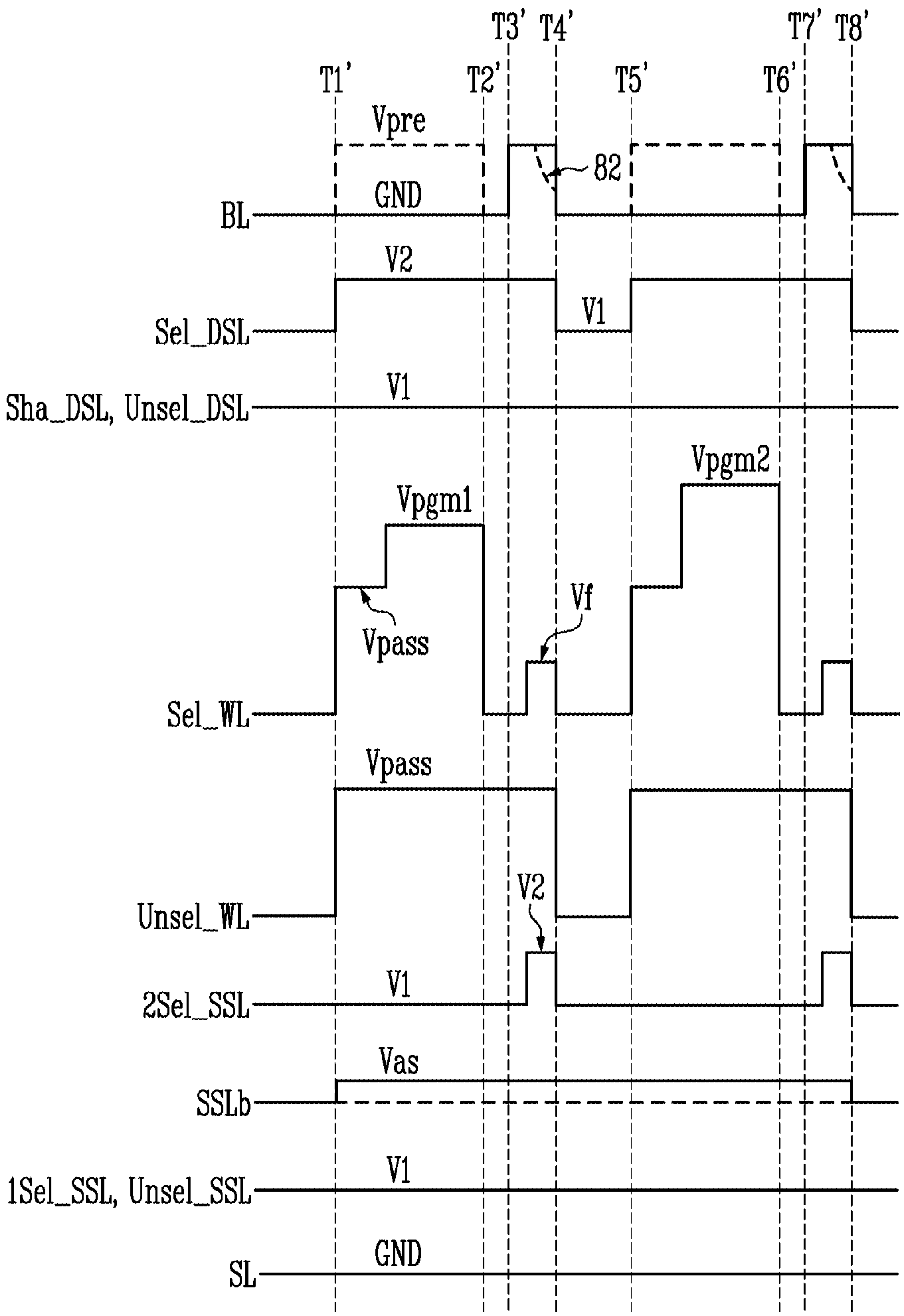
FIG. 8 is a timing diagram illustrating a program operation according to an embodiment of the present disclosure.

FIG. 8 is a timing diagram illustrating a program operation according to an embodiment of the present disclosure.

Referring to FIG. 8, during a period from 1'-th to 2'-th times T1'-T2', a program step may be performed, and during a period from 2'-th to 3'-th times T2'-T3', a discharge step may be performed, during a period from 3'-th to 4'-th times T3'-T4', a verify step may be performed, and a period from 4'-th to 5'-th times T4'-T5', a discharge step may be performed. The program operation may be performed in an incremental step pulse program (ISPP) manner. In the ISPP method, whenever a program loop is performed, a program voltage is stepwise increased. Therefore, during a period from 5'-th to 6'-th times T5'-T6', a program step with a higher program voltage may be performed, during a period from 6'-th to 7'-th times T6'-T7', a discharge step may be performed, and during a period from 7'-th to 8'-th times T7'-T8', a verify step may be performed. Because the program loop may be performed such that the threshold voltages of selected memory cells increase to a target voltage within a preset number of times, the program loop may be further performed even after the 8'-th time T8'.

Individual steps will be described in detail below.

During the period from the 1'-th to 2'-th times T1'-T2', a ground voltage GND may be applied to bit lines selected from among the bit lines, and the precharge voltage Vpre higher than the ground voltage GND may be applied to unselected bit lines. The precharge voltage Vpre may be a program-inhibit voltage for preventing or mitigating unselected memory cells from being programmed, and the ground voltage GND may be a program-enable voltage for programming the selected memory cells. The precharge voltage Vpre corresponding to the program-inhibit voltage may be set to various levels, and the program-enable voltage might not be limited to the ground voltage GND. The ground voltage GND may be applied to the source line SL. A second voltage V2 may be applied to the selected drain select line Sel_DSL, and a first voltage V1 may be applied to the shared drain select line Sha_DSL and unselected drain select lines Unsel_DSL. A pass voltage Vpass may be applied to a selected word line Sel_WL and unselected word lines Unsel_WL. The pass voltage Vpass may be a voltage for forming channels in the strings, and may be set to a positive voltage higher than 0 V. When a specific time has elapsed since the application of the pass voltage Vpass to the selected word line Sel_WL, a first program voltage Vpgm1 may be applied to the selected word line Sel_WL.

The first voltage V1 may be applied to first and second selected source select lines 1Sel_SS and 2Sel_SS and unselected source select lines Unsel_SSL, and an auxiliary voltage Vas may be applied to a buffer source select line SSLb. The auxiliary voltage Vas may be set to have a level between the first voltage V1 and the second voltage V2.

The selected memory cells in the selected strings connected to the selected drain select line Sel_DSL may be programmed due to the difference between the first program voltage Vpgm1 and the voltages of the selected bit lines.

During the period from the 2'-th to 3'-th times T2'-T3', the lines, except the selected drain select line Sel_DSL, the unselected word lines Unsel_WL, and the buffer source select line SSLb, may be discharged.

During the period from 3'-th to 4'-th times T3'-T4', a verify step of determining whether the threshold voltages of the memory cells have increased to a target voltage may be performed. Assuming that, as in the embodiment described with reference to FIG. 5, the source select transistors 51 are coded, the precharge voltage Vpre may be applied to all bit lines BL at 3'-th time T3'. Subsequently, a verify voltage Vf may be applied to the selected word line Sel_WL, and the second voltage V2 may be applied to the second selected source select line Sel_SSL. This is intended to electrically connect the channel of the selected string Sel_ST to the source line SL and to electrically disconnect the channels of the shared string Sha_ST and the unselected strings Unsel_ST from the source line SL.

During the period from 4'-th to 5'-th times T4'-T5', lines except the buffer source select line SSLb may be discharged.

During the period from 5'-th to 8'-th times T5'-T8', the steps performed during the period from 1'-th to 4'-th times T1'-T4' may be repeated, and the program voltage applied to the selected word line Sel_WL may increase to a second program voltage Vpgm2.

The program operation on the selected page may be performed until all of the threshold voltages of the selected memory cells included in the selected page reach the target voltages.

Figure 9:
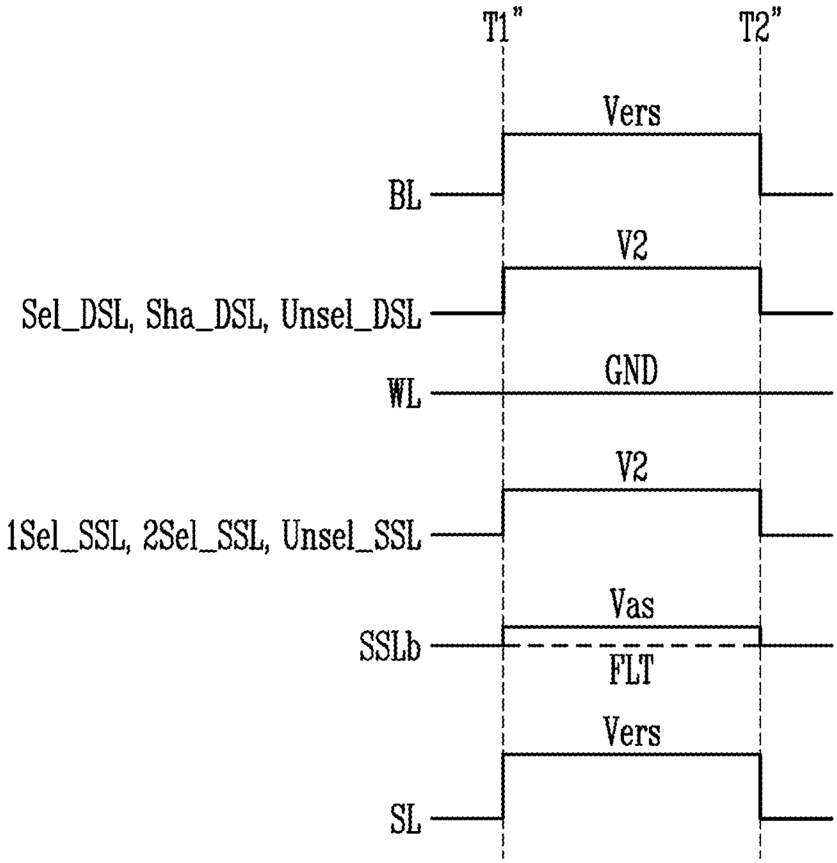
FIG. 9 is a timing diagram illustrating an erase operation according to an embodiment of the present disclosure.

FIG. 9 is a timing diagram illustrating an erase operation according to an embodiment of the present disclosure.

Referring to FIG. 9, the erase operation may be performed on a selected memory block during a period from 1"-th to 2"-th times T1"-T2". During the erase operation, when the 1"-th time T1" is reached, an erase voltage Vers may be applied to the bit lines BL and the source line SL. Alternatively, the erase voltage Vers may be applied to the bit lines BL or the source line SL.

A second voltage V2 may be applied to a selected drain select line Sel_DSL, a shared drain select line Sha_DSL, and unselected drain select lines Unsel_DSL, first and second selected source select lines 1Sel_SSL and 2Sel_SSL, and unselected source select lines Unsel_SSL.

An auxiliary voltage Vas may be applied to the buffer source select line SSLb. The auxiliary voltage Vas may be set to have a level between the first voltage V1 and the second voltage V2. Alternatively, the buffer source select line SSLb may remain floating (FLT).

A ground voltage GND may be applied to word lines WL, whereby the memory cells connected to the word lines WL may be erased.

Figure 10:
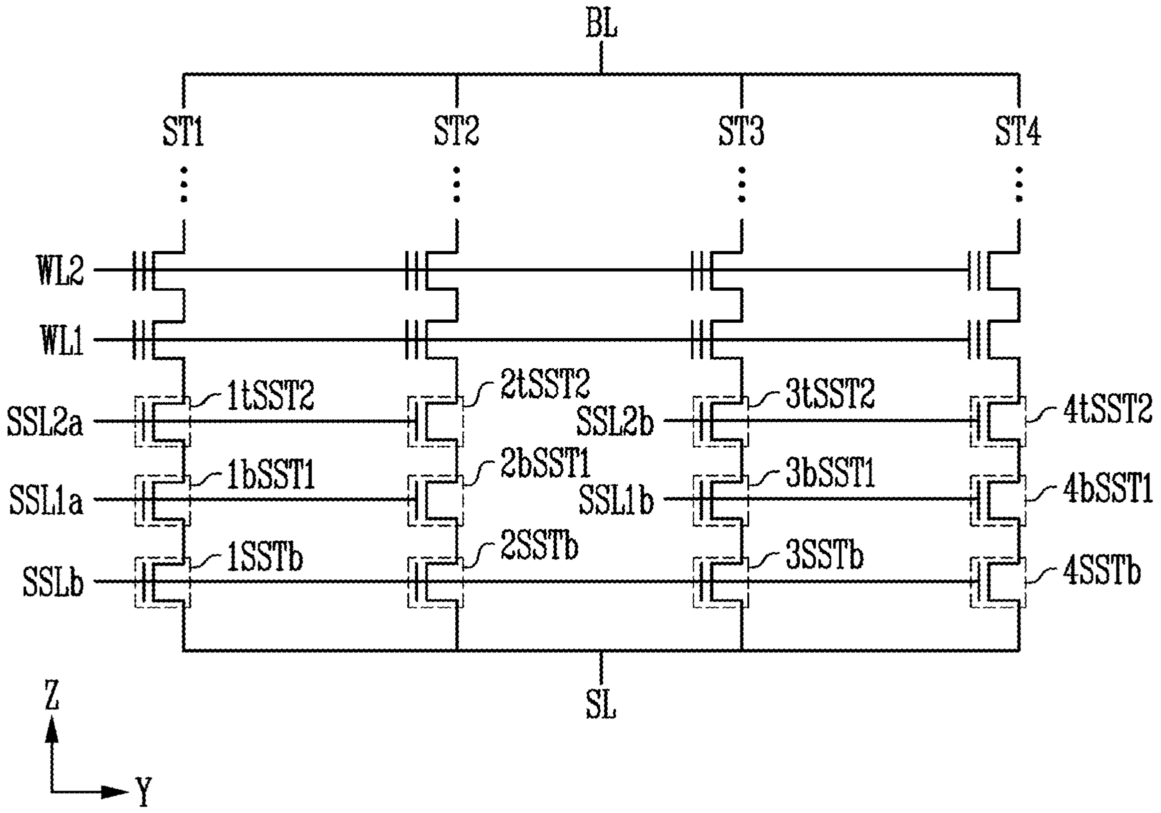
FIG. 10 is a circuit diagram illustrating a memory block according to a second embodiment of the present disclosure.

FIG. 10 is a circuit diagram illustrating a memory block according to a second embodiment of the present disclosure.

Referring to FIG. 10, in the memory block according to the second embodiment, a buffer source select line SSLb may be disposed between 1a-th and 1b-th source select lines SSL1*a* and SSL1*b* and a source line SL. The 1a-th and 1b-th source select lines SSL1*a* and SSL1*b* may be disposed between the buffer source select line SSLb and 2a-th and 2b-th source select lines SSL2*a* and SSL2*b*. The 2a-th and 2b-th source select lines SSL2*a* and SSL2*b* may be disposed between the 1a-th and 1b-th source select lines SSL1*a* and SSL1*b* and a first word line WL1.

The buffer source select line SSLb may be connected in common to gates of first to fourth buffer source select transistors 1SSTb to 4SSTb. The 1a-th source select line SSL1*a* may be connected in common to gates of first and second bottom source select transistors 1*b*SST1 and 2*b*SST1. The 1b-th source select line SSL1*b* may be connected in common to gates of third and fourth bottom source select transistors 3*b*SST1 and 4*b*SST1. The 2a-th source select line SSL2*a* may be connected in common to gates of first and second top source select transistors 1*t*SST2 and 2*t*SST2. The 2b-th source select line SSL2*b* may be connected in common to gates of third and fourth top source select transistors 3*t*SST2 and 4*t*SST2.

Figure 11:
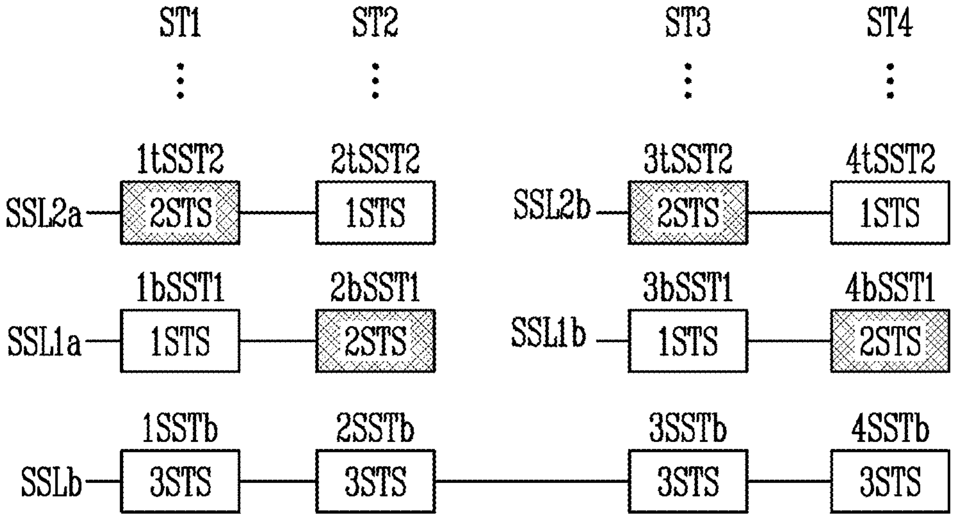
FIG. 11 is a diagram illustrating a method of coding source select transistors according to a second embodiment.

FIG. 11 is a diagram illustrating a method of coding source select transistors according to a second embodiment.

Referring to FIGS. 10 and 11, source select transistors included in the same string may be coded to different states, and all of buffer source select transistors may be coded to an erase state. For example, all of the first to fourth buffer source select transistors 1SSTb to 4SSTb may be coded to a third state 3STS. Among source select transistors included in the first string ST1, the first bottom source select transistor 1*b*SST1 may be coded to a first state 1STS, and the first top source select transistor 1*t*SST2 may be coded to a second state 2STS. Among source select transistors included in the second string ST2, the second bottom source select transistor 2*b*SST1 may be coded to the second state 2STS, and the second top source select transistor 2*t*SST2 may be coded to the first state 1STS. Among source select transistors included in the third string ST3, the third bottom source select transistor 3*b*SST1 may be coded to the first state 1STS, and the third top source select transistor 3*t*SST2 may be coded to the second state 2STS. Among source select transistors included in the fourth string ST4, the fourth bottom source select transistor 4*b*SST1 may be coded to the second state 2STS, and the fourth top source select transistor 4*t*SST2 may be coded to the first state 1STS.

Figure 12:
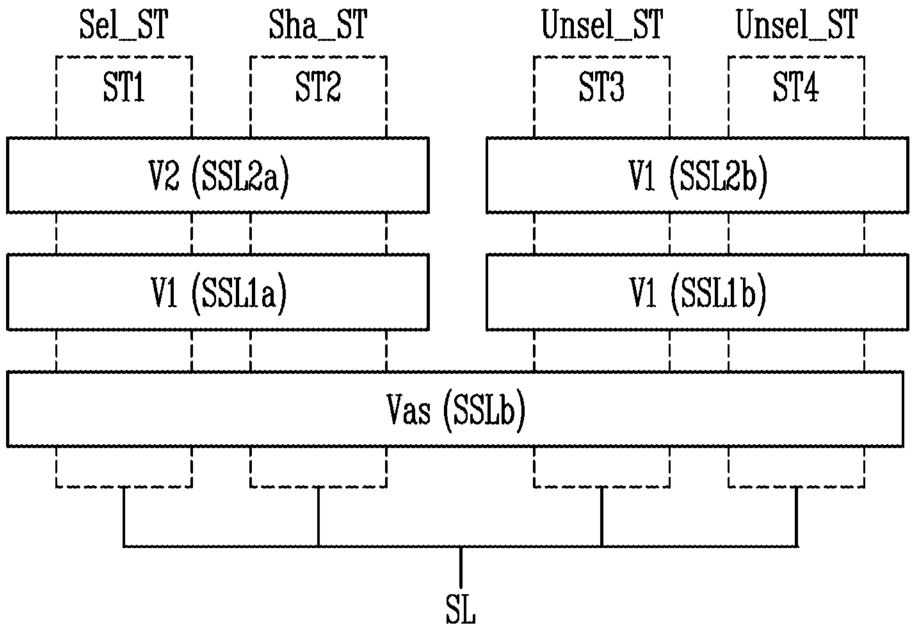
FIG. 12 is a diagram illustrating voltages applied to source select lines according to a second embodiment.

FIG. 12 is a diagram illustrating voltages applied to source select lines according to a second embodiment.

Referring to FIGS. 11 and 12, it is assumed that the first string ST1 is a selected string Sel_ST, the second string ST2 is a shared string Sha_ST, and the third and fourth strings ST3 and ST4 are unselected strings Unsel_ST.

In the selected string Sel_ST, in order to electrically connect a channel to the source line SL, a first voltage V1 may be applied to the 1a-th source select line SSL1*a*, and a second voltage V2 may be applied to the 2a-th source select line SSL2*a*. An auxiliary voltage Vas may be applied to the buffer source select line SSLb. Due thereto, the first top source select transistor 1*t*SST2 in the second state 2STS and the first bottom source select transistor 1*b*SST1 in the first state 1STS may be turned on. The auxiliary voltage Vas may be set to have a level between the first voltage V1 and the second voltage V2. In an embodiment, the first buffer source select transistor 1SSTb included in the selected string Sel_ST may be used to allow current to flow between the channel and the source line SL.

In the shared string Sha_ST connected in common to the 1a-th source select line SSL1*a* and the 2a-th source select line SSL2*a*, the second bottom source select transistor 2*b*SST1 in the second state 2STS is turned off, whereby the channel and the source line SL may be electrically disconnected from each other. In an embodiment, the second buffer source select transistor 2SSTb included in the shared string Sha_ST may be used to suppress leakage between the turned-off second bottom source select transistor 2*b*SST1 and the source line SL.

Because the first voltage V1 is applied to the 1b-th source select line SSL1*b* and the 2b-th source select line SSL2*b* connected to the unselected strings Unsel_ST, the third top source select transistor 3*t*SST2 and the fourth bottom source select transistor 4*b*SST1 are turned off, whereby channels of the unselected strings Unsel_ST may be electrically disconnected from the source line SL. In an embodiment, the third and fourth buffer source select transistors 3SSTb and 4SSTb included in the unselected strings Unsel_ST may be used to suppress leakage between the channels and the source line SL.

Figure 13:
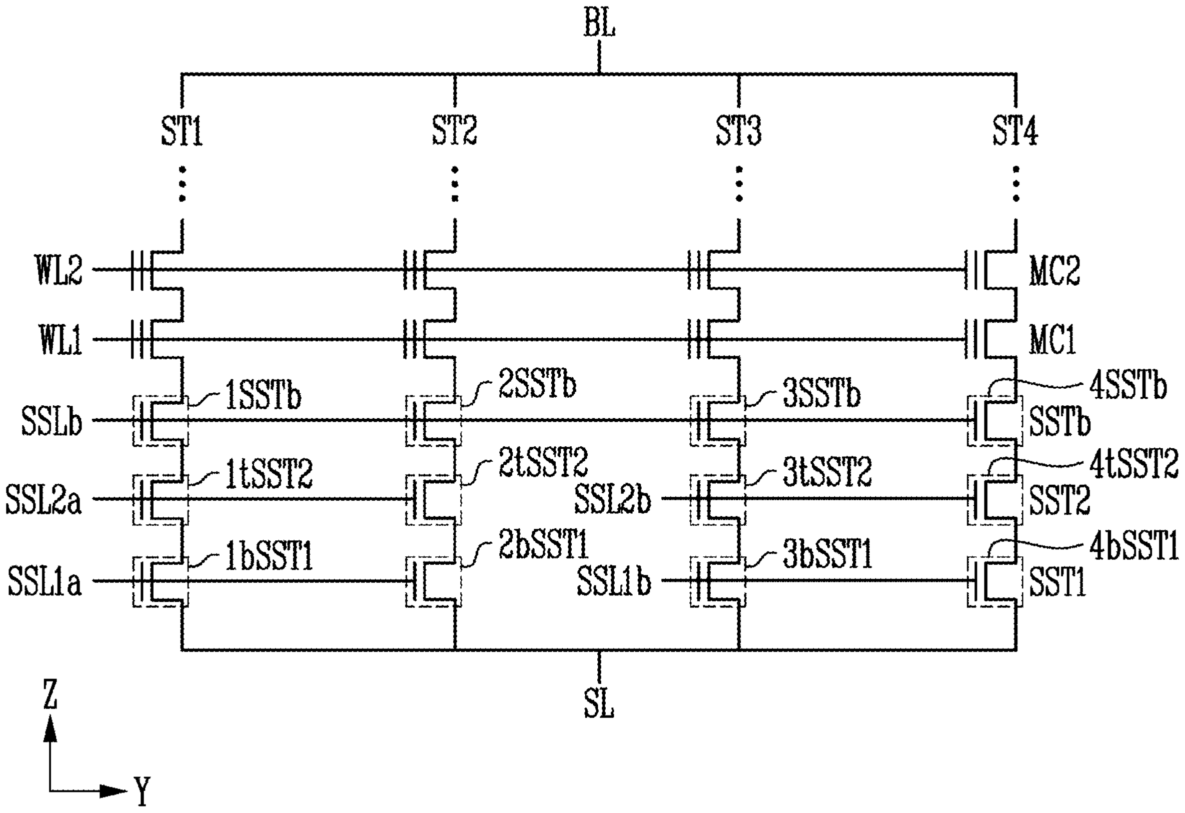
FIG. 13 is a circuit diagram illustrating a memory block according to a third embodiment of the present disclosure.

FIG. 13 is a circuit diagram illustrating a memory block according to a third embodiment of the present disclosure.

Referring to FIG. 13, in the memory block according to the third embodiment, a buffer source select line SSLb may be disposed between 2a-th and 2b-th source select lines SSL2*a* and SSL2*b* and a first word line WL1. The 2a-th and 2b-th source select lines SSL2*a* and SSL2*b* may be disposed between the buffer source select line SSLb and 1a-th and 1b-th source select lines SSL1*a* and SSL1*b*. The 1a-th and 1b-th source select lines SSL1*a* and SSL1*b* may be disposed between the 2a-th and 2b-th source select lines SSL2*a* and SSL2*b* and a source line SL.

The buffer source select line SSLb may be connected in common to gates of first to fourth buffer source select transistors 1SSTb to 4SSTb. The 1a-th source select line SSL1*a* may be connected in common to gates of first and second bottom source select transistors 1*b*SST1 and 2*b*SST1. The 1b-th source select line SSL1*b* may be connected in common to gates of third and fourth bottom source select transistors 3*b*SST1 and 4*b*SST1. The 2a-th source select line SSL2*a* may be connected in common to gates of first and second top source select transistors 1*t*SST2 and 2*t*SST2. The 2b-th source select line SSL2*b* may be connected in common to gates of third and fourth top source select transistors 3*t*SST2 and 4*t*SST2.

Figure 14:
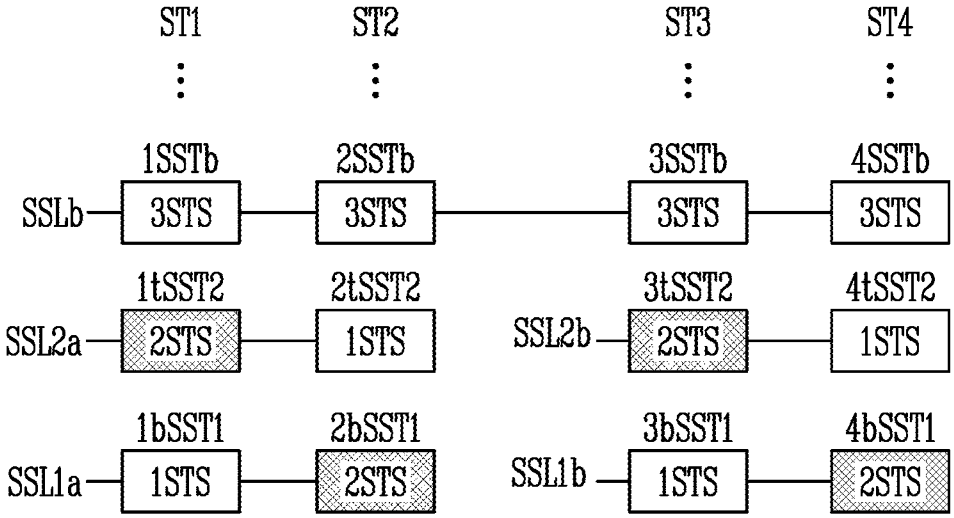
FIG. 14 is a diagram illustrating a method of coding source select transistors according to a third embodiment.

FIG. 14 is a diagram illustrating a method of coding source select transistors according to a third embodiment.

Referring to FIGS. 13 and 14, source select transistors included in the same string may be coded to different states, and all of buffer source select transistors may be coded to an erase state. For example, among source select transistors included in the first string ST1, the first bottom source select transistor 1*b*SST1 may be coded to a first state 1STS, and the first top source select transistor 1*t*SST2 may be coded to a second state 2STS. Among source select transistors included in the second string ST2, the second bottom source select transistor 2*b*SST1 may be coded to the second state 2STS, and the second top source select transistor 2*t*SST2 may be coded to the first state 1STS. Among source select transistors included in the third string ST3, the third bottom source select transistor 3*b*SST1 may be coded to the first state 1STS, and the third top source select transistor 3*t*SST2 may be coded to the second state 2STS. Among source select transistors included in the fourth string ST4, the fourth bottom source select transistor 4*b*SST1 may be coded to the second state 2STS, and the fourth top source select transistor 4*t*SST2 may be coded to the first state 1STS. All of the first to fourth buffer source select transistors 1SSTb to 4SSTb may be coded to a third state 3STS.

Figure 15:
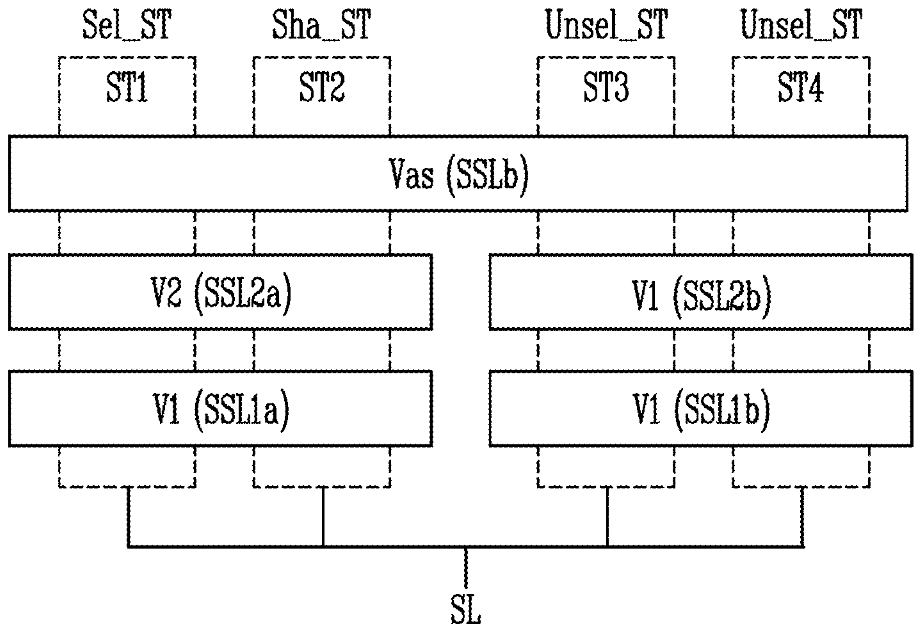
FIG. 15 is a diagram illustrating voltages applied to source select lines according to a third embodiment.

FIG. 15 is a diagram illustrating voltages applied to source select lines according to a third embodiment.

Referring to FIGS. 14 and 15, it is assumed that the first string ST1 is a selected string Sel_ST, the second string ST2 is a shared string Sha_ST, and the third and fourth strings ST3 and ST4 are unselected strings Unsel_ST.

In the selected string Sel_ST, in order to electrically connect a channel to the source line SL, a first voltage V1 may be applied to the 1a-th source select line SSL1*a*, and a second voltage V2 may be applied to the 2a-th source select line SSL2*a*. An auxiliary voltage Vas may be applied to the buffer source select line SSLb. Due thereto, the first top source select transistor 1*t*SST2 in the second state 2STS and the first bottom source select transistor 1*b*SST1 in the first state 1STS may be turned on. The auxiliary voltage Vas may be set to have a level between the first voltage V1 and the second voltage V2. In an embodiment, the first buffer source select transistor 1SSTb included in the selected string Sel_ST may be used to allow current to flow between the channel and the source line SL.

In the shared string Sha_ST connected in common to the 1a-th source select line SSL1*a* and the 2a-th source select line SSL2*a*, the second bottom source select transistor 2*b*SST1 in the second state 2STS is turned off, whereby the channel and the source line SL may be electrically disconnected from each other. In an embodiment, the second buffer source select transistor 2SSTb included in the shared string Sha_ST may be used to suppress leakage between the turned-off second bottom source select transistor 2*b*SST1 and the channel.

Because the first voltage V1 is applied to the 1b-th source select line SSL1*b* and the 2b-th source select line SSL2*b* connected to the unselected strings Unsel_ST, the third top source select transistor 3*t*SST2 and the fourth bottom source select transistor 4*b*SST1 are turned off, whereby channels of the unselected strings Unsel_ST may be electrically disconnected from the source line SL. In an embodiment, the third and fourth buffer source select transistors 3SSTb and 4SSTb included in the unselected strings Unsel_ST may be used to suppress leakage between the channels and the source line SL.

Figure 16:
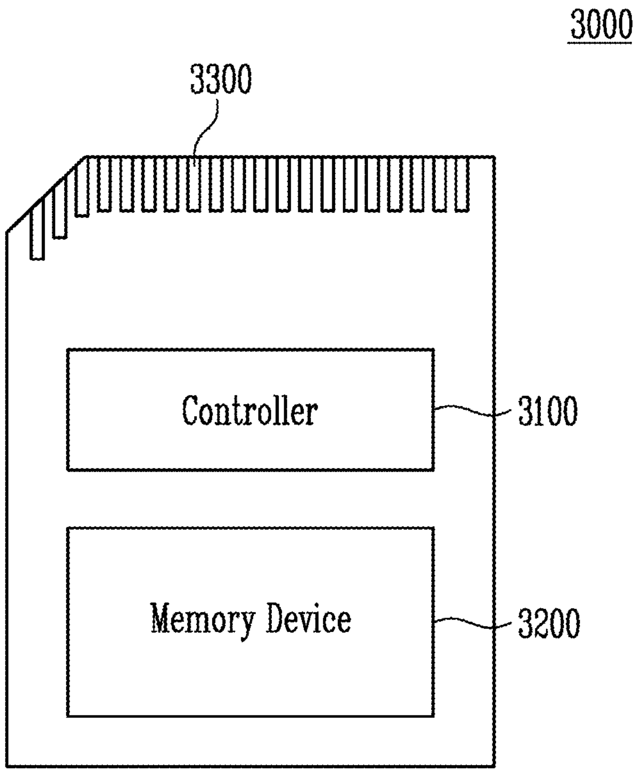
FIG. 16 is a diagram illustrating a memory card system to which a memory system according to an embodiment of the present disclosure is applied.

FIG. 16 is a diagram illustrating a memory card system to which a memory system according to an embodiment of the present disclosure is applied.

Referring to FIG. 16, a memory card system 3000 includes a controller 3100, a memory device 3200, and a connector 3300.

The controller 3100 is connected to the memory device 3200. The controller 3100 may access the memory device 3200. For example, the controller 3100 may control a program, a read, or an erase operation of the memory device 3200 or control background operations of the memory device 3200. The controller 3100 may provide an interface between the memory device 3200 and a host. The controller 3100 may run firmware for controlling the memory device 3200. In an embodiment, the controller 3100 may include components, such as a RAM, a processor, a host interface, a memory interface, and an error correction circuit.

The controller 3100 may communicate with an external device through the connector 3300. The controller 3100 may communicate with an external device (e.g., a host) based on a specific communication standard. In an embodiment, the controller 3100 may communicate with the external device through at least one of various communication standards such as universal serial bus (USB), multimedia card (MMC), embedded MMC (eMMC), peripheral component interconnection (PCI), PCI-express (PCI-E), an advanced technology attachment (ATA), serial-ATA (SATA), parallel-ATA (PATA), small computer system interface (SCSI), enhanced small disk interface (ESDI), integrated drive electronics (IDE), Firewire, universal flash storage (UFS), WiFi, Bluetooth, and nonvolatile memory express (NVMe). In an embodiment, the connector 3300 may be defined by at least one of the above-described various communication standards.

The memory device 3200 may include memory cells, and may be configured in the same manner as the memory device 100 illustrated in FIG. 1.

The controller 3100 and the memory device 3200 may be integrated into a single semiconductor device to form a memory card. For example, the controller 3100 and the memory device 3200 may be integrated into a single semiconductor device and may then form a memory card such as a PC card (personal computer memory card international association: PCMCIA), a compact flash card (CF), a smart media card (SM or SMC), a memory stick, a multimedia card (MMC, RS-MMC, MMCmicro or eMMC), a SD card (SD, miniSD, microSD, or SDHC), universal flash storage (UFS), or the like.

Figure 17:
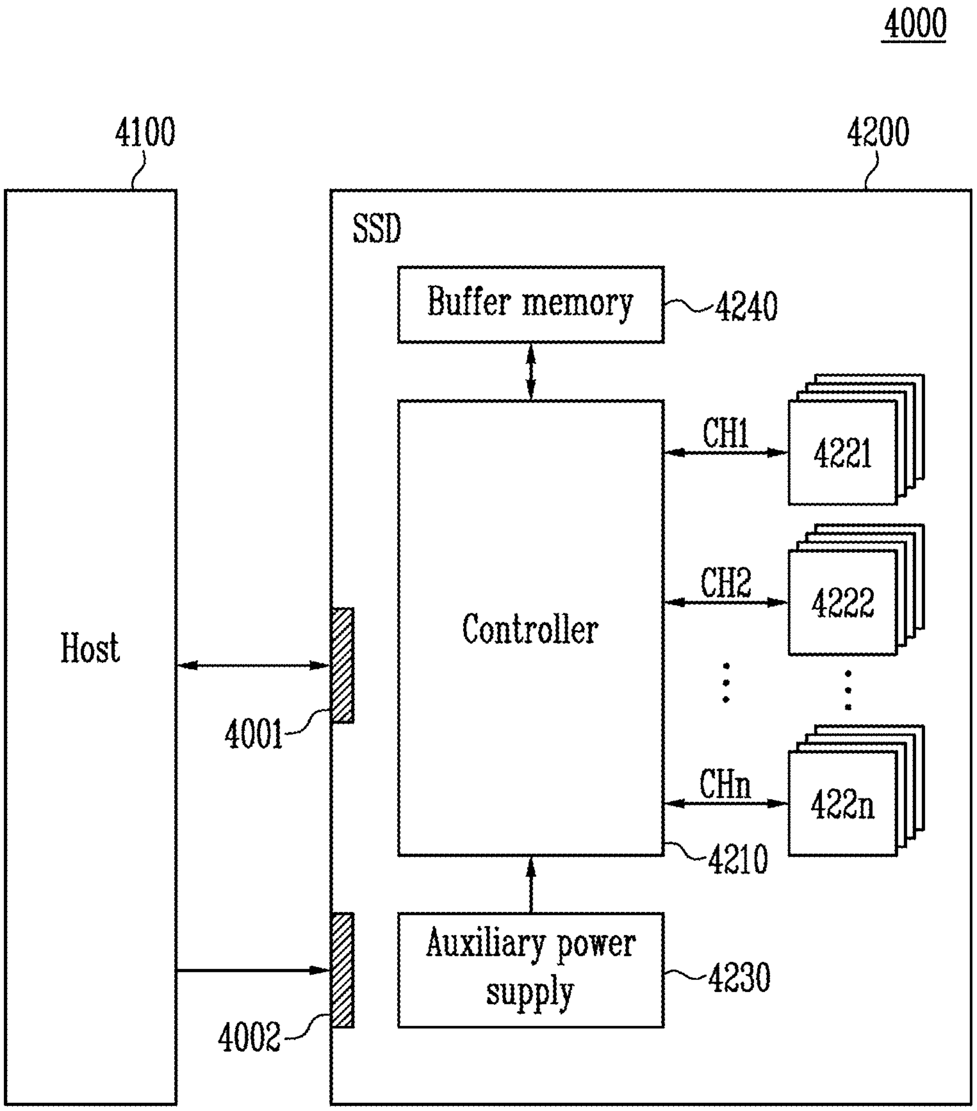
FIG. 17 is a diagram illustrating a solid state drive (SSD) system to which a memory device according to an embodiment of the present disclosure is applied.

FIG. 17 is a diagram illustrating a solid state drive (SSD) system to which a memory device according to an embodiment of the present disclosure is applied.

Referring to FIG. 17, an SSD system 4000 may include a host 4100 and an SSD 4200. The SSD 4200 may exchange signals with the host 4100 through a signal connector 4001, and may receive power through a power connector 4002. The SSD 4200 may include a controller 4210, a plurality of memory devices 4221 to 422*n*, an auxiliary power supply 4230, and a buffer memory 4240.

The controller 4210 may control the plurality of memory devices 4221 to 422*n* in response to signals received from the host 4100. In an embodiment, the signals may be signals based on the interfaces of the host 4100 and the SSD 4200. For example, the signals may be signals defined by at least one of interfaces such as universal serial bus (USB), multimedia card (MMC), embedded MMC (eMMC), peripheral component interconnection (PCI), PCI-express (PCI-E), advanced technology attachment (ATA), serial-ATA (SATA), parallel-ATA (PATA), small computer system interface (SCSI), enhanced small disk interface (ESDI), integrated drive electronics (IDE), Firewire, universal flash storage (UFS), WiFi, Bluetooth, and nonvolatile memory express (NVMe).

Each of the plurality of memory devices 4221 to 422*n* may include cells in which data can be stored. Each of the plurality of memory devices 4221 to 422*n* may be configured in the same manner as the memory device 100 illustrated in FIG. 1.

The auxiliary power supply 4230 may be connected to the host 4100 through the power connector 4002. The auxiliary power supply 4230 may be supplied with a supply voltage from the host 4100, and may be charged. The auxiliary power supply 4230 may provide the supply voltage of the SSD 4200 when the supply of power from the host 4100 is not smoothly performed. In an embodiment, the auxiliary power supply 4230 may be located inside the SSD 4200 or located outside the SSD 4200. For example, the auxiliary power supply 4230 may be located on a main board, and may also provide auxiliary power to the SSD 4200.

The buffer memory 4240 functions as a buffer memory of the SSD 4200. For example, the buffer memory 4240 may store data received from the host 4100 or data received from the plurality of memory devices 4221 to 422*n* or may store metadata (e.g., mapping tables) of the memory devices 4221 to 422*n*. The buffer memory 4240 may include volatile memories, such as DRAM, SDRAM, DDR SDRAM, and LPDDR SDRAM, or nonvolatile memories, such as FRAM, ReRAM, STT-MRAM, and PRAM.

According to various embodiments of the present disclosure, the reliability of a memory device may be improved by suppressing leakage that may occur in memory blocks.

What is claimed is:

1. A memory device, comprising:

a string connected between a bit line and a source line, wherein the string comprises:

one or more memory cells;

a drain select transistor connected between the one or more memory cells and the bit line; and first and second source select transistors and a buffer source select transistor connected between the one or more memory cells and the source line, wherein the first and second source select transistors have different threshold voltages, and wherein the buffer source select transistor has a threshold voltage lower than a higher threshold voltage between the threshold voltages of the first and second source select transistors.

2. The memory device according to claim 1, wherein:

the first source select transistor has a negative threshold voltage, and the second source select transistor has a positive threshold voltage.

3. The memory device according to claim 2, wherein, when the string is a selected string, a first voltage is applied to a first source select line connected to a gate of the first source select transistor and a buffer source select line connected to a gate of the buffer source select transistor, and a second voltage higher than the first voltage is applied to a second source select line connected to a gate of the second source select transistor.

4. The memory device according to claim 3, wherein, when the string is an unselected string, the first voltage is applied to the first source select line, the second source select line, and the buffer source select line.

5. The memory device according to claim 4, wherein, when the string is an unselected string, a ground voltage is applied to the first source select line, the second source select line, and the buffer source select line.

6. The memory device according to claim 4, wherein:

the buffer source select transistor is connected between the first and second source select transistors, the first source select transistor is connected between the buffer source select transistor and the source line, and the second source select transistor is connected between the buffer source select transistor and the one or more memory cells.

7. The memory device according to claim 4, wherein the first and second source select transistors are connected in series to each other.

8. The memory device according to claim 1, wherein the drain select transistor is in a program state.

9. A memory device, comprising:

first, second, third, and fourth strings connected in parallel between a bit line and a source line, wherein each of the first, second, third, and fourth strings comprises:

one or more memory cells connected between the bit line and the source line;

a drain select transistor connected between the one or more memory cells and the bit line; and first and second source select transistors and a buffer source select transistor connected between the one or more memory cells and the source line, wherein the first and second source select transistors have different threshold voltages, and wherein the buffer source select transistor has a threshold voltage lower than a higher threshold voltage between the threshold voltages of the first and second source select transistors.

10. The memory device according to claim 9, wherein a gate of the buffer source select transistor included in the first string, a gate of the buffer source select transistor included in the second string, a gate of the buffer source select transistor included in the third string, and a gate of the buffer source select transistor included in the fourth string are connected in common to a buffer source select line.

11. The memory device according to claim 9, wherein:

a gate of the first source select transistor included in the first string and a gate of the first source select transistor included in the second string are connected in common to a first source select line, and a gate of the first source select transistor included in the third string and a gate of the first source select transistor included in the fourth string are connected in common to a second source select line.

12. The memory device according to claim 11, wherein the first source select line and the second source select line are electrically disconnected from each other.

13. The memory device according to claim 9, wherein:

a gate of the second source select transistor included in the first string and a gate of the second source select transistor included in the second string are connected in common to a third source select line, and a gate of the second source select transistor included in the third string and a gate of the second source select transistor included in the fourth string are connected in common to a fourth source select line.

14. The memory device according to claim 13, wherein the third source select line and the fourth source select line are electrically disconnected from each other.

15. The memory device according to claim 9, wherein:

a gate of the drain select transistor included in the first string is connected to a first drain select line, a gate of the drain select transistor included in the second string is connected to a second drain select line, a gate of the drain select transistor included in the third string is connected to a third drain select line, and a gate of the drain select transistor included in the fourth string is connected to a fourth drain select line.

16. The memory device according to claim 15, wherein the first, second, third, and fourth drain select lines are electrically isolated from each other.

17. The memory device according to claim 9, wherein, in each of the first, second, third, and fourth strings, the buffer source select transistor is connected between the first and second source select transistors, the first source select transistor is connected between the buffer source select transistor and the source line, and the second source select transistor is connected between the buffer source select transistor and the one or more memory cells.

18. The memory device according to claim 9, wherein, in each of the first, second, third, and fourth strings, the first source select transistor is connected between the buffer source select transistor and the second source select transistor, the buffer source select transistor is connected between the first source select transistor and the source line, and the second source select transistor is connected between the first source select transistor and the one or more memory cells.

19. The memory device according to claim 9, wherein, in each of the first, second, third, and fourth strings:

the second source select transistor is connected between the buffer source select transistor and the first source select transistor, the first source select transistor is connected between the second source select transistor and the source line, and the buffer source select transistor is connected between the second source select transistor and the one or more memory cells.

20. The memory device according to claim 9, wherein:

when the first source select transistor included in the first string is in a first state, the second source select transistor included in the first string and the first source select transistor included in the second string are in a second state different from the first state, and the second source select transistor included in the second string is in the first state.

21. The memory device according to claim 9, wherein:

when the first source select transistor included in the third string is in a first state, the second source select transistor included in the third string and the first source select transistor included in the fourth string are in a second state different from the first state, and the second source select transistor included in the fourth string is in the first state.

22. A method of operating a memory device, comprising:

when a first string among first, second, third, and fourth strings is selected, wherein each of the first, second, third, and fourth strings includes first and second source select transistors and a buffer source select transistor that are connected between one or more memory cells and a source line and coded to different states, and wherein the buffer source select transistor has a threshold voltage lower than a higher threshold voltage between threshold voltages of the first and second source select transistors, turning on the first and second source select transistors included in the first string;

turning off at least one of the first and second source select transistors included in each of the second to fourth strings; and reducing an amount of current flowing through the buffer source select transistor included in each of the first to fourth strings compared to an amount of current flowing through each of turned-on first and second source select transistors.

23. The method according to claim 22, wherein turning on the first and second source select transistors included in the first string comprises:

applying a ground voltage to a gate of a transistor in a first state between the first and second source select transistors; and applying a turn-on voltage to a gate of a transistor in a second state having a threshold voltage higher than a threshold voltage in the first state between the first and second source select transistors.

24. The method according to claim 23, wherein the turn-on voltage is set to a positive voltage higher than the ground voltage.

25. The method according to claim 23, wherein the ground voltage or a voltage between the ground voltage and the turn-on voltage is applied to a gate of the buffer source select transistor included in each of the first, second, third, and fourth strings.

26. The method according to claim 22, wherein turning off the at least one of the first and second source select transistors included in each of the second to fourth strings comprises:

applying a ground voltage to a gate of a transistor in a program state between the first and second source select transistors.

* * * * *